(12) United States Patent
Sul et al.

(10) Patent No.: US 8,026,726 B2
(45) Date of Patent: Sep. 27, 2011

(54) FAULT TESTING FOR INTERCONNECTIONS

(75) Inventors: Chinsong Sul, Mountain View, CA (US);
Gijung Ahn, Sunnyvale, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 249 days.

(21) Appl. No.: 12/359,025

(22) Filed: Jan. 23, 2009

(65) Prior Publication Data

US 2010/0188097 A1    Jul. 29, 2010

(51) Int. Cl.
*G01R 31/02* (2006.01)
(52) U.S. Cl. .................................. 324/543; 324/750.01
(58) Field of Classification Search .................. 324/765, 324/543, 750.01
See application file for complete search history.

(56) References Cited

U.S. PATENT DOCUMENTS

| 5,621,741 A | 4/1997 | Kohiyama |
| 2009/0102503 A1* | 4/2009 | Saito .............................. 324/765 |

FOREIGN PATENT DOCUMENTS

EP            1612573 A2    1/2006

OTHER PUBLICATIONS

International Search Report & Written Opinion for International Application No. PCT/US2010/021859 mailed May 6, 2010.
Andrews, John , "Integration of IEEE 1149.1 with Mixed ECL, TTL, and Differential Logic Signals", Proceedings of European Test Conference 93, Los Alamito, CA, IEEE Computer Society, Apr. 19, 1993, pp. 355-360.
Eklow, Bill , et al., "IEEE 1149.6—A Practical Perspective", ITC International Test Conference, Paper 19.1, IEEE, 2003, pp. 494-502.
Haulin, Tord , "Built-in Parametric Test for Controlled Impedance I/Os", VLSI Test Symposium, 1997, Los Alamitos, CA, IEEE Computer Society, Apr. 27, 1997, pp. 123-128.

* cited by examiner

*Primary Examiner* — Vincent Q Nguyen
(74) *Attorney, Agent, or Firm* — Blakely Sokoloff Taylor & Zafman

(57) ABSTRACT

Embodiments of the invention are generally directed to fault testing for interconnections. An embodiment of a fault analysis apparatus includes a test pattern source to provide a test pattern for an interconnection between a transmitter and a receiver, the interconnection having a transmitter end and a receiver end, the interconnection including a first wire and a second wire, the transmitter transmitting the test pattern on the first wire to the receiver. The apparatus further includes a first switch to open and close a first connection for the first wire, and a second switch to open and close a second connection for the second wire. The first switch and the second switch are to be set according to a configuration to set at least a portion of a test path for the detection of one or more faults in the interconnection.

38 Claims, 20 Drawing Sheets

(a) OPEN 310

(b) STUCK-AT 320

STUCK-AT-X (c) BRIDGING 330

(a) controls[2] = 0001

(b) controls[0] = 0100

|  | Test configurations | | | |
|---|---|---|---|---|
| links | k=3 | 2 | 1 | 0 |
| links[0] | 0 | 0 | 0 | 0 ← i value in controls[i] |
| links[1] | 0 | 0 | 0 | 1 |
| links[2] | 0 | 0 | 1 | 0 |
| links[3] | 0 | 0 | 1 | 1 |
| links[4] | 0 | 1 | 0 | 0 |
| links[5] | 0 | 1 | 0 | 1 |
| links[6] | 0 | 1 | 1 | 0 |
| links[7] | 0 | 1 | 1 | 1 |

Test configurations in Figure 16 (k=0 column)
Test configurations in Figure 17 (k=1, 2 columns)
Test configurations in Figure 15 (k=3 column)

FIG. 18

FAULT TESTING FOR INTERCONNECTIONS

TECHNICAL FIELD

Embodiments of the invention generally relate to the field of electronics and, more particularly, to a method and apparatus for fault testing for interconnections.

BACKGROUND

IO (input/output) links for electronic device in communication may be implemented in various forms, including parallel and serial link implementations. Because of cost advantages offered by differential high-speed IO (HSIO) serial link technology, the serial HSIO became an attractive alternative over the conventional parallel IO. Commonly addressed disadvantages of parallel IO may include high pin count, routing resource, and skew among parallel data bits.

An HSIO serial link provides a high-bandwidth communication channel that may match or exceed data rate of parallel IO. A parallel data may be serialized before transmission, and received serialized data may be de-serialized into parallel data at the receiver. The HSIO serial links may reduce pin count and simplify layout issues by eliminating trace match and congestion. Because data is transmitted serially, there is no need to maintain phase relationships among individual data bits.

A serial link may provide for differential signaling. Differential signaling may be used to immunity against certain common noise. The differential interconnection may be utilized to efficiently remove the common noise added during transmission. In operation, the HSIO interconnections may carry the clock signals and the transmitted data, with the clock signals embedded into the data or provided separately.

An HSIO serial link commonly employs a differential signaling scheme. Differential signaling uses a pair of wires: one of the wires carries a signal (which may be referred to as $V_p(t)$), while the other wire carries the inverse of the signal ($V_n(t)$). The wires that carry $V_p(t)$ and $V_n(t)$ are referred to as the positive and negative interconnection wires respectively. A receiver may recover data based on the difference between the signals being propagated on the complementary interconnection wires. The difference between the signals, which may be denoted as $V_{diff}(t)$, may be defined as $V_{diff}(t)=V_p(t)-V_n(t)$. Noise that is added to both $V_p(t)$ and $V_n(t)$ during transmission may be subtracted away, and thus be removed from the $V_{diff}(t)$.

The sign of $V_{diff}(t)$ may be interpreted as an intended logic value. That is, ideally, the positive or the negative value of $V_{diff}(t)$ may be interpreted as logical '1' or '0' respectively. If, for example, $V_p(t)=250$ mV and $V_n(t)=-250$ mV, then $V_{diff}(t)=500$ mV>0 may be interpreted as logical '1'. Similarly, $V_{diff}(t)=-500$ mV<0 may be interpreted as logical '0' if $V_p(t)=-250$ mV and $V_n(t)=250$ mV. In practice, the minimum value of $V_{diff}(t)$ for logical '1' and '0' may be smaller than $V_p(t)$ and $V_n(t)$ respectively. This thus may allow the serial link to be functional and not necessarily to be failed even if one of differential IO lines is defective. However, this may create a potential test problem when defects may be masked during a test, but may cause failure in system application. Thus, detection and proper diagnosis of such defects may be challenging in an HSIO interconnection test.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 18 illustrates test configurations to detect bridging faults;

SUMMARY

Figure 1A:
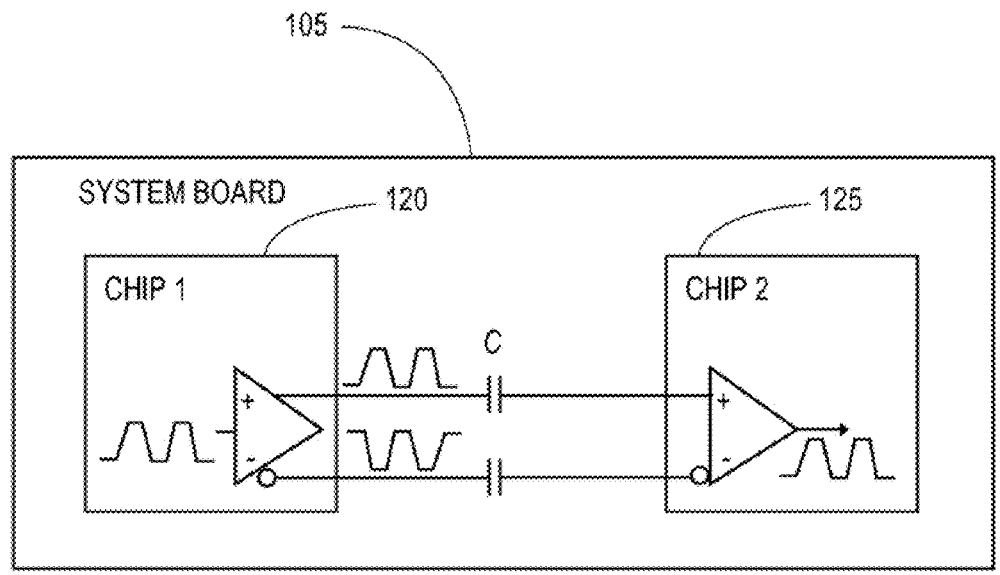
FIGS. 1A and 1B are illustrations of high speed IO connections for analysis using an embodiment of fault testing.

Embodiments of the invention are generally directed to fault testing for interconnections.

In a first aspect of the invention, an embodiment of a fault analysis apparatus includes a test pattern source to provide a test pattern for an interconnection between a transmitter and a receiver, the interconnection having a transmitter end and a receiver end, the interconnection including a first wire and a second wire, the transmitter transmitting the test pattern on the first wire to the receiver. The apparatus further includes a first switch to open and close a first connection for the first wire, and a second switch to open and close a second connection for the second wire. The first switch and the second switch are to be set to a configuration for the detection of one or more faults in the interconnection.

In a second aspect of the invention, a method includes applying a first test pattern to a first wire of an interconnect, wherein the interconnect includes the first wire and a second wire. A first control signal is sent to a first switch, with the first switch to open or close a first connection for the first wire based on the first control signal. A second control signal is sent to a second switch, with the second switch to open or close a second connection for the second wire based on the second control signal. The interconnection is monitored for received signals, and a determination is made regarding whether a fault exists in the interconnection based on the monitoring for received signals.

DETAILED DESCRIPTION

Embodiments of the invention are generally directed to a test structure for input/output (I/O) interconnections.

As used herein:

"Interconnection" means any signal interconnection between devices to transfer input or output signals.

"High speed I/O interconnection" or "HSIO interconnection" means any I/O interconnection that operates at relatively high speeds.

In some embodiments, a test structure is provided to test differential interconnections between devices. For example, the test structure may be utilized to detect and to locate faults in an interconnection between a transmitter and a receiver. A test structure to test interconnections may also be referred to herein as an interconnection fault analyzer. In some embodiments, a high-speed input-output (HSIO) interconnection test structure is provided to test AC and DC-coupled differential interconnections between communicating devices assembled on the system board. In some embodiments, a testing structure may be utilized to detect and locate one or more faults, wherein the faults may include stuck-at, open, and bridging faults. In some embodiments, a testing structure may be utilized to analyze coupling noise or crosstalk affecting signal integrity.

In some embodiments, a test structure may enable a targeted interconnection test to be integrated into a conventional functional test. The test structure may in some embodiments utilize existing on-chip functional and test hardware, such as a signal detector and a built-in self-test (BIST) circuitry that may be used in functional tests of HSIO interface circuitry. In comparison with the requirements for IEEE standard 1149.6 (IEEE STD 1149.6, March 2003) with regard to high speed interface testing, an embodiment may run HSIO interconnection test at functional speed and may provide a simpler implementation without requiring extra analog circuitry to observe the test response, without requiring IEEE standard conformance verification, as required for Standard 1149.6.

In some embodiments, an HSIO differential interconnection test structure may be utilized to simplify the HSIO interconnection test. In an embodiment of a test structure, a targeted interconnection test may be carried out in the same manner as a functional test. In some embodiments, the test structure may be utilized to detect and locate open, stuck-at, and bridging faults, and may be extended to detect and locate crosstalk resulting from routing channel placement. The test may also be utilized to locate and reconstruct topology of multiple faults from the collected test results. In some embodiments, the hardware overhead of the test structure may be small because existing functional and BIST hardware may be utilized for testing. Further, the test structure may be utilized to improve quality of board products and speed up the volume ramp for products with reduced engineering effort.

Figure 1B:
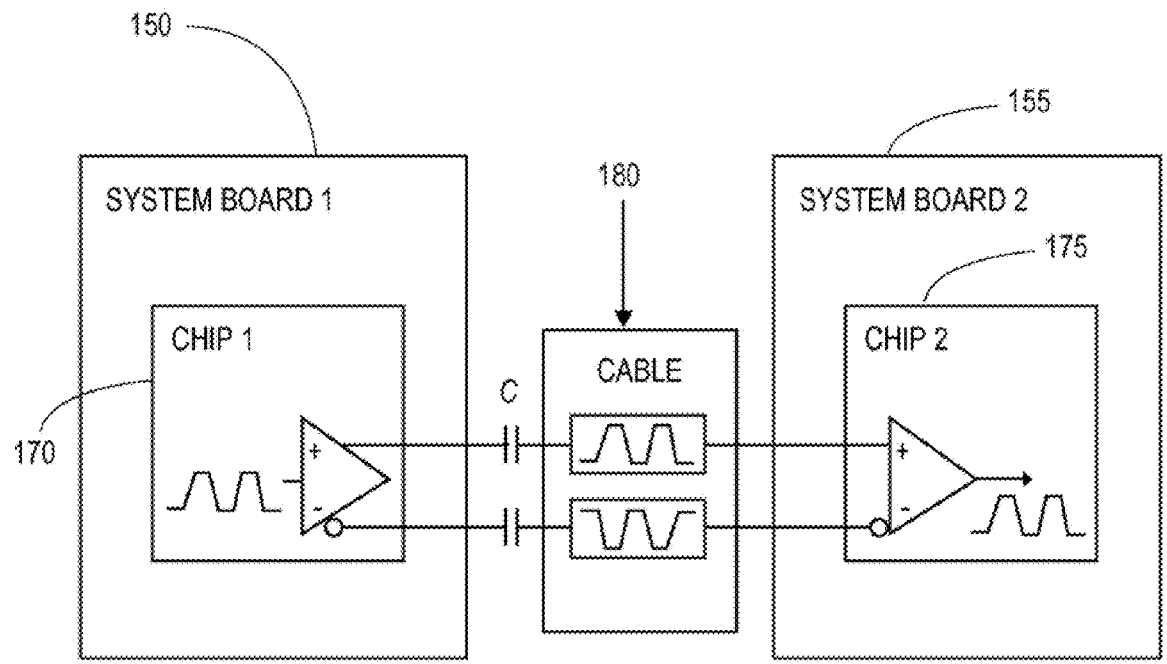

FIGS. 1A and 1B illustrate embodiments of analysis of high speed IO connections utilizing fault testing. If the HSIO interconnections connect the devices on the same board as in FIG. 1A, such as chip 1 120 and chip 2 125 on system board 105, the interconnections may be tested in a simple implementation using an embodiment of a test structure. If, however, the two devices reside on the different boards and are connected via a cable as in FIG. 1B, such as chip 1 170 on system board 1 150 and chip 2 175 on system board 2 155 linked by cable 180, then more diversified tests may be applied directly through the cable or to the sockets for the chips. The cable may be taken out and the board interfaces, including high interconnection wires through sockets, may be directly targeted by the external test equipments. In either circumstance, an embodiment of a test structure and accompanying test method may be utilized to support testing and diagnosis of failures. Embodiments of testing systems and processes include the implementations illustrated in both FIGS. 1A and 1B. Embodiments described herein are generally discussed with reference to the implementation illustrated in FIG. 1A, but are not limited to this implementation.

Figure 2A:
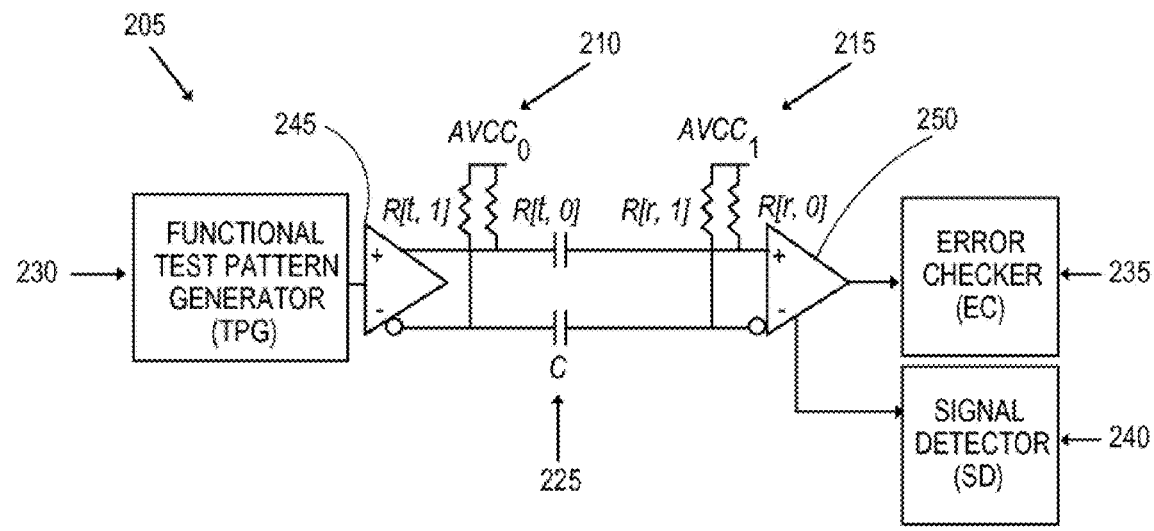
FIG. 2A is an illustration of an AC-coupled high speed IO interconnection for analysis using an embodiment of fault testing.
Figure 2B:
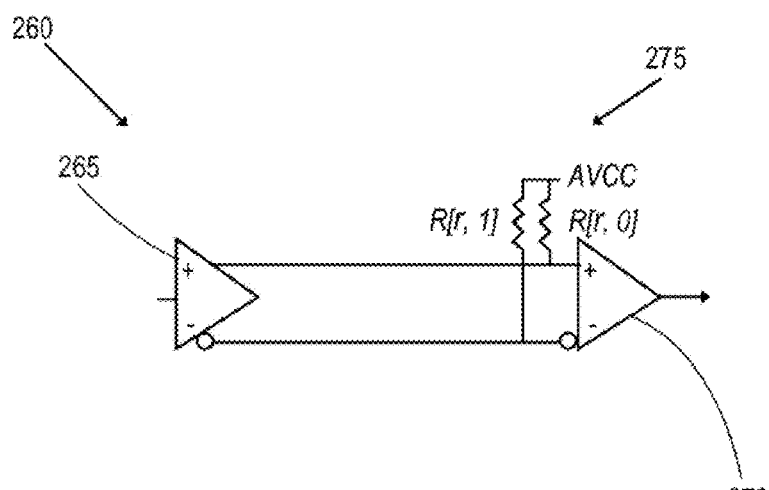
FIG. 2B is an illustration of an DC-coupled high speed IO interconnection for analysis using an embodiment of fault testing.

In some embodiments, differential interconnection implementations used in HSIO technology may include AC-coupled and DC-coupled interconnections. FIG. 2A is an illustration of an AC-coupled high speed IO interconnection 205 for analysis using an embodiment of fault testing. FIG. 2B is an illustration of a DC-coupled high speed IO interconnection 260 for analysis using an embodiment of fault testing. As shown in FIG. 2A, the system may include a functional test pattern generator (TPG) 230 providing test waveform signals (or test patterns) to a transmitter (TX) 245, with the signals being received by a receiver (RX) 250 and provided to an error checker 235 and a signal detector 240. The AC-coupled interconnection 205 may include capacitors 225 to block the DC component of a signal in order to pass only AC signal components. The AC-coupled link may be powered by separate power sources at the transmitter TX ($AVCC_0$ 210) and the receiver RX ($AVCC_1$ 215) with separate termination resistors, R[t,1], R[t,0], R[r,1], and R[r,0], as shown in FIG. 2A. In the DC-coupled interconnection, on the other hand, a direct connection may be made from the transmitter 265 to the receiver 270, and which allows both the DC and AC components of a signal to pass through the interconnection. In the DC-coupled interconnection, the transmitter 265 may be directly powered from the receiver 270, with no capacitors present in the connection between transmitter and receiver. The termination resistors, R[r, 1] and R[r,0], may commonly be implemented in the receiver as shown in FIG. 2B.

In general, an advantage of AC-coupling over DC-coupling is decoupling between the transmitter and the receiver. In comparison with the DC-coupled implementation, the transmitter and the receiver for AC-coupled structure may be designed to be more independent of each other. Because generally only AC signal components carry meaningful messages, such components may be offset by different independent DC voltages at the transmitter and the receiver, allowing independent power supplies to be employed in each side. Thus, if it is possible for an AC signal to be consistently interpreted, an AC-coupled interconnection may be utilized to separate the design concerns of transmitter from those of receiver.

However, fault detection in AC-coupled interconnections may be more difficult than in the DC-coupled interconnections. In the case of DC-coupled interconnections, test methods may be utilized to detect failures on the DC-coupled interconnections based on measurements of electrical quantities, such as current and/or voltage. If the power voltage (AVCC) 275 is supplied by the receiver 270 as shown in FIG. 2B, for example, detection of the AVCC voltage at the transmitter may be utilized to detect open interconnection failures. However, the same method would not be applied to an AC-coupled interconnection test because no DC signal component is passed through the capacitors. The AC-coupled interconnection test requires the test pattern to be comprised of AC signals and thus testing may be relatively complex. In some embodiments, a test method may be applied to both AC and DC-coupled interconnections. In this discussion, the proposed method is generally discussed using the more complex AC-coupled interconnection.

Figure 3:
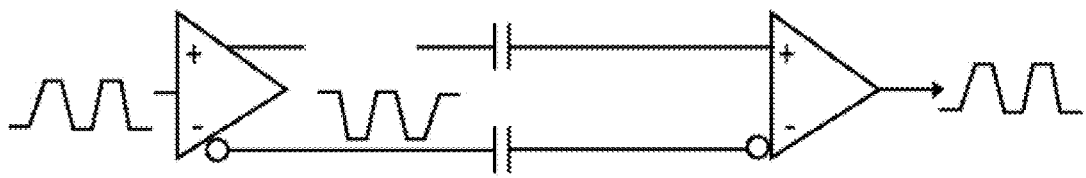
FIG. 3 is an illustration of common fault models for detection using an embodiment of a fault analysis system.
Figure 3:
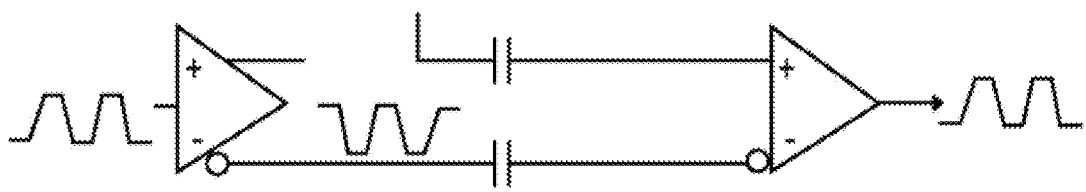
Figure 3:
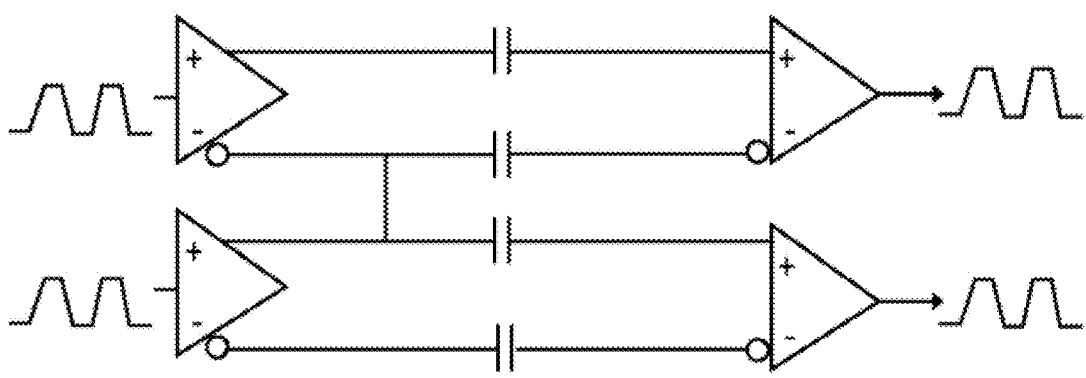

FIG. 3 is an illustration of common fault models for detection using an embodiment of a fault analysis system. Because interconnection traces may be very fine and may be placed close to each other in multiple layers, the interconnection wires may in certain circumstances be open 310, stuck-at power buses 320, or shorted with other interconnection wires 330 (referred to as bridging). For the stuck-at cases 320, "stuck-at-x" indicates a stuck-at power case (denoted as x=1) and stuck-at indicates a stuck at ground case (denoted as x=0). FIG. 3 illustrates a difficulty of testing HSIO serial interconnections. Even if one of two interconnections in a link has a fault caused by the open 310, the stuck-at 320 or the bridging 330 conditions, a test pattern or test waveform may be successfully recovered at the receiver. Hence the faults may not be detected. In the AC-coupled interconnection, the stuck-at fault 320 may be recognized as an open condition. In some embodiments, the stuck-at test and diagnostic may be separated from those of open test in order to increase diagnostic resolution. The bridging fault 330 may result with any number of interconnection wires. In some embodiments, a detection system provides for detection and diagnosis of multiple bridging faults.

In order to mitigate high-speed differential IO interconnection test problems, the IEEE standard committee proposed the standard solution referred to as IEEE STD 1149.6. However, the IEEE STD 1149.6 may require significant engineering resources and extra test hardware to implement the HSIO interconnection test. The IEEE standard also requires that the provided test hardware be validated in order to be in conformance of the standard. Because an HSIO interconnection test may often be run at a slower speed than a functional speed in an IEEE 1149.6 environment, practical test issues such as crosstalk and other parametric defects related to frequency may not be checked efficiently in such environment.

Figure 4:
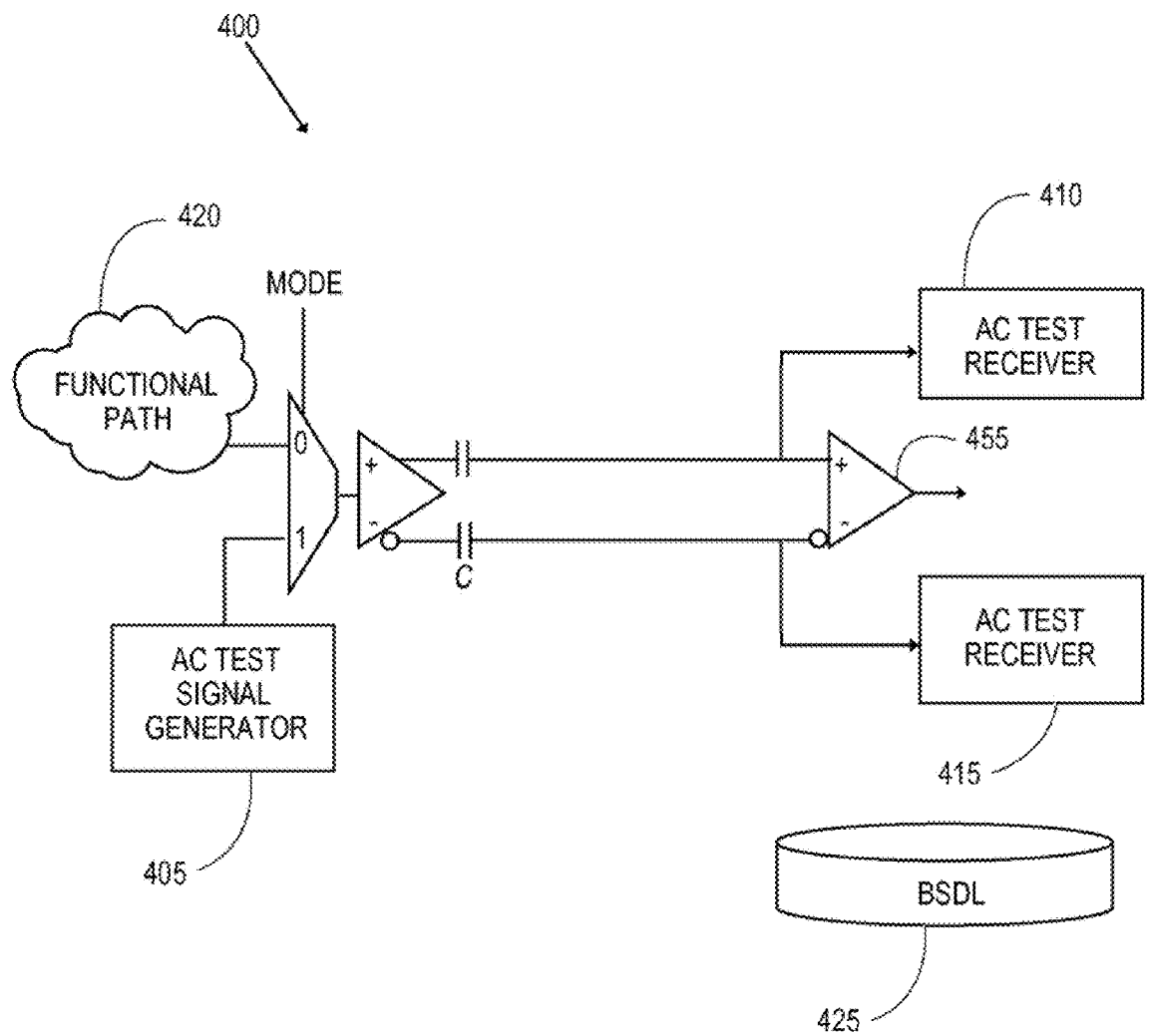
FIG. 4 is an illustration of an IEEE standard test process.

FIG. 4 is an illustration of an IEEE standard test process. In this illustration, a transmitter TX 450 is coupled to a receiver RX 455. The IEEE standard test process utilizes a separate AC test signal generator 405 and two AC test receivers 410-415 to observe faults in each differential IO. In some embodiments, the AC test signal generator 405 may be operated at a slower speed than the functional path 420 for the system. The AC test receivers 410-415 may be required to detect small AC signals on $V_p$ and $V_n$ (e.g. 250 mV peak-to-peak). The AC test receivers 410-415 often are analog circuits, and such circuits may require testing before usage. Design and testing of high speed AC test receivers can be challenging if the test is to run at a functional speed, which may often be a few GHz (109 Hz). According to the IEEE standards, the AC-boundary scan design must also be described in Boundary Scan Description Language (BSDL) 425, and the design description must also be verified before it is provided to the board-level system manufactures for the interconnection test generation. Verification of IEEE standard compliance may require development or purchase of the verification software.

In some embodiments, a testing system or process is provided for an HSIO interconnection test without requiring significant hardware and verification software overhead. In some embodiments, fault detection may be carried out the same way as a functional test to test the link integrity using the built-in self-test (BIST) circuitry. In some embodiment, the fault detection test may involve transmission of test patterns or test pattern waveforms in the form of differential AC-signals ($V_p$ and $V_n$). In such process, errors may be detected using existing BIST circuitry at the receiver after data recovery.

In this description, the test pattern assumed a system may be patterns that contain a maximum number of transitions: '1010 . . . 10' and '0101 . . . 01'. Any available test patterns, however, may also be used. Fault diagnostics of multiple faults may be obtained from the test results collected from the test of individual interconnection wires. In some embodiments, the test results may be collected in such a way that a topology of faults may be reconstructed from the collected test results.

A test structure may be implemented in many different forms in varying embodiments. For on-chip implementation, the function of the test structure may be implemented anywhere in the circuit under test to open and to close the interconnection wires. In some embodiments, the structure may also be implemented as a switch to turn on and off the power on each side of an interconnection wire. The switch function may be implemented in varying ways. Because a system function to turn on and off the termination resistors may often be available, the same system function may be reutilized to implement a proposed test structure for the purpose of fault testing. In this case, the test structure may be viewed or implemented as switches to turn on or off the power on the interconnection wires between a source and a sink.

Figure 5:
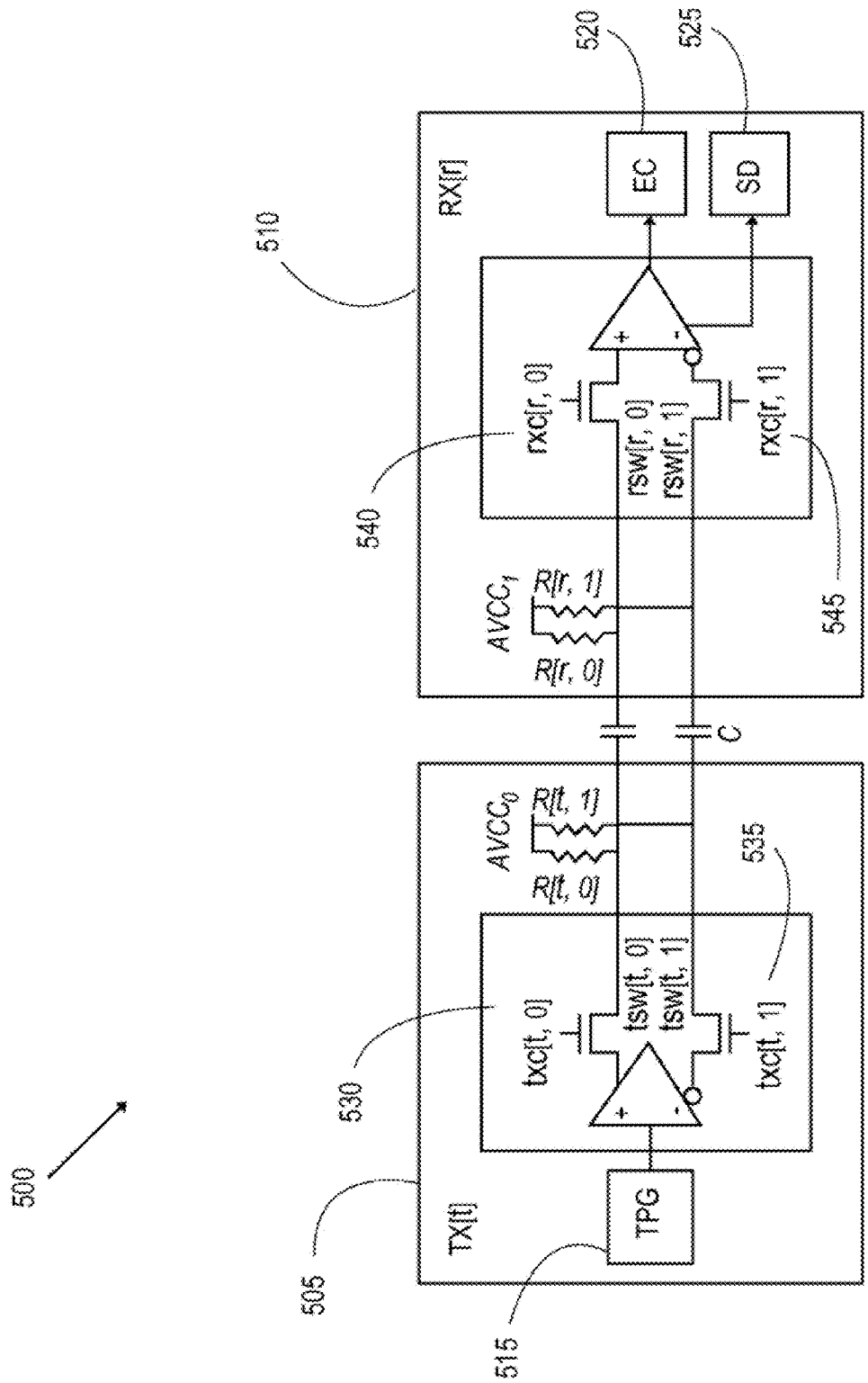
FIG. 5 is an illustration of an embodiment of an interconnection fault analyzer.

FIG. 5 is an illustration of an embodiment of an interconnection fault analyzer. FIG. 5 provides a functional view of the HSIO interconnection test structure, while the function of test structure may be implemented anywhere in the circuit. A basic concept of the test structure is to provide a flexible test control structure to configure the path of interest on which the test may be run to detect faults. In this description, the signal path of interest is called a test path. The test structure provides a control mechanism to establish the test paths to detect faults in IO interconnections.

Because the main function of HSIO interconnection is to establish a point-to-point connection, this description generally assumes that there are N number of transmitters and the same number N of receivers. Each instance of a transmitter is denoted as TX[t] 505 and each instance of a receiver is denoted as RX[r] 510. In this description, t=r if the TX[t] and the RX[r] were connected to form a channel link, denoted as link[r] for $0 \leq r \leq N-1$. While FIG. 5 illustrates test waveforms being provided by the transmitter 505, in other embodiments a testing structure may be implemented using a tester (including, for example, automatic test equipment (ATE)) as the transmitter 505, in which the tester provides test waveforms to the positive and negative interconnection ports of receiver 510.

As shown in FIG. 5, the test structure may be viewed as switch functions. FIG. 5 illustrates an embodiment having four simple switches or switch functions (530, 535, 540, 545). In some embodiments, each switch or switch function may be controlled independently, and may be utilized to establish varying test paths. The switches or switch functions may be implemented in varying ways and in varying locations in the test structure. For example, in some embodiments the switches may be implemented to turn on or off power ($AVCC_0$ or $AVCC_1$) through the illustrated termination resistors R[t,0], R[t,1], R[r,0], and R[r,1]. As illustrated in FIG. 5, each switch or switch function (or simply referred to herein as a "switch") is controlled by the control input txc[t,i] in the transmitter TX[r] and the control input rxc[r,j] in the receiver RX[r], where $0 \leq i,j \leq 1$. The individual index of the control or switch, [*,0] and [*,1], may be combined as [*, 1:0]. Using the terminology provided here, if the txc[t,i] (rxc[r,j])=1 or 0, the switch tsw[t,i] (rsw[r,j]) in the test structure is turned on or off respectively. While this terminology is used here, any signaling designation may be used for the described control signals. The transmitter driver receives an input from a test pattern generator (TPG) 515. If the switch tsw[t,i] is turned on, this enables the corresponding output of the transmitter driver from which the test pattern to be transmitted over the enabled interconnection. The enabled output of the transmitter driver is called a test pattern source. In the illustrated system, each TX includes two test pattern sources, such sources being a positive test pattern source and a negative (or inverse or differential) test pattern source. While this description refers to two test pattern sources, the positive and negative patterns may be generated by a single source or apparatus. With differential signaling, the positive test pattern source may carry a set of generated test patterns whereas the negative test pattern source carries a bit-wise complement of the set of generated test patterns. In this illustration, the positive test pattern source and the negative test pattern source of TX[t] are enabled by the switch control inputs tsw[t,0] and tsw[t,1] respectively. Similarly, the switch rsw[r,j] enables (or connects) corresponding positive or negative test pattern sinks, at which point an error may be checked or presence of a signal may be detected, the receiver RX[r] including, for example, an error checker (EC) 520 and a signal detector (SD) 525. In this illustration, t=r because the TX[t] 505 and RX[r] 510 are connected to form the link[r].

In some embodiments, a test path may be established by providing the control inputs, txc[t,1:0] and rxc[r,1:0], to the corresponding switches. If, for example, a test path for detecting open faults on the positive interconnection wire of a link is established, the control inputs txc[r,1:0]=01 and rxc[r,1:0]=01 may be provided to close the switches tsw[t,0] and rsw[r,0] and to open the switches tsw[t,1] and rsw[r,1] The control inputs txc[t,1:0] and rxc[r,1:0] may be represented by the switches that they close. For example, the control inputs txc[t,1:0]^rxc[r,1:0]='0101', '1101' and '0100' may be represented by (tsw[t,0], rsw[r,0]), (tsw[t,*], rsw[r,0]) and (tsw [t,0], rsw[r,⊥]), where ^ denotes concatenation and where the symbols * and ⊥ denote all and no switches respectively. Thus, tsw[t,*] and rsw[r,⊥] denote respectively that all switches in the TX[t] and no switches in the RX[r] are closed. Note that because the test path may be established by the control inputs txc[r, 1:0] and rxc[t, 1:0], the test path may be represented by the switches that are turned on in the path.

In this description, the switch controls of all links for each interconnection test run are referred to as a "test configuration". The test configuration contains the test paths established in all links under test. A certain number of test configurations may be required to complete a desired interconnection test. For example, test configurations '1010' and '0101' may be required to complete detection of the open faults. Embodiments of an open test are discussed further below.

In some embodiment, test structures may be implemented on-chip or off-chip (indicating that the test structures are or are not included within a chip that is a subject of a test), depending on the particular applications. If the test structure is provided on-chip, txc[t,1:0] and rxc[r,1:0] may be registered and loaded serially via, for example, well known IO interfaces such as the IEEE STD 1149.1 Boundary Scan interface. For devices that are partially equipped with or completely lack an embodiment of a test structure, a test structure may be implemented using external hardware. If, for example, a board is to be used in testing devices (known as a DUT, or device under test, board) or in device characterization, the test structure may be implemented using external hardware.

In some embodiments, a testing structure, such as illustrated in FIG. 5, may utilize existing signal detector and/or built-in self-test (BIST) hardware used to validate integrity of physical layer (PHY) hardware. In general, a signal detector is a part of a system function to detect the presence of signals on the differential link. The BIST hardware may include a test pattern generator and an error checker. In some embodiments, the desired test pattern may be generated and sent over the differential interconnections at functional speed via the transmitter PHY hardware. The transmitted signal may be recovered at the receiver and checked for the error. If an error is detected, one or more error detector flags indicate the existence of the detected error. At the same time, the signal detector may check presence of AC signal and indicate the detection result accordingly.

Figure 6:
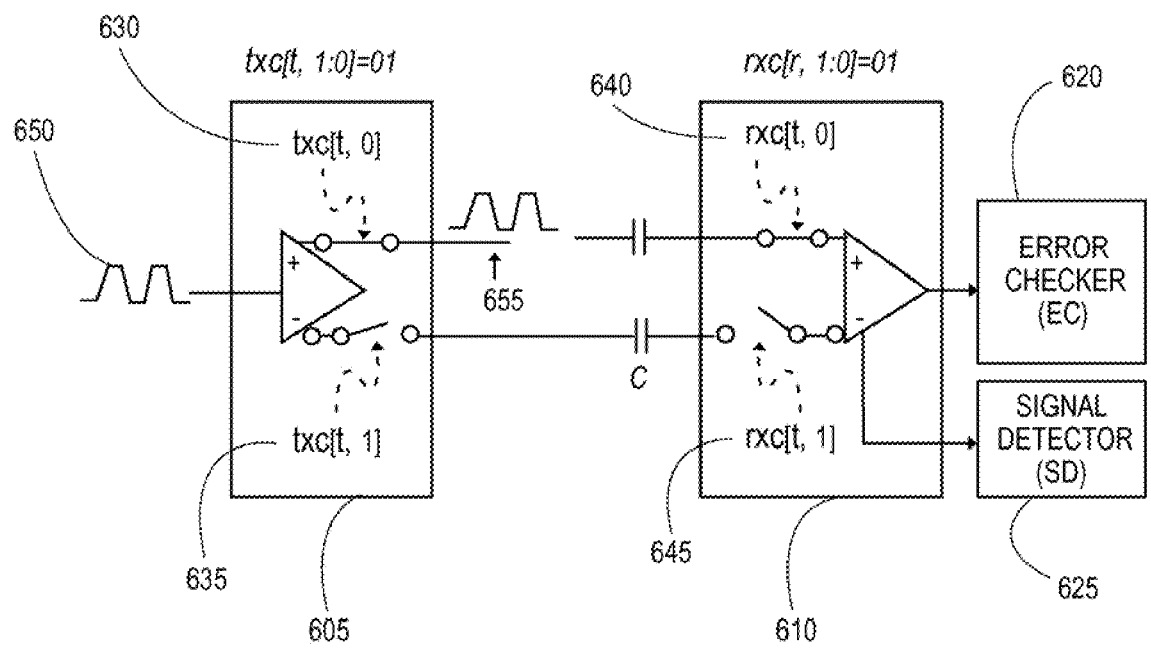
FIG. 6 is an illustration of an embodiment of detection of stuck-at and open interconnection faults.

FIG. 6 is an illustration of an embodiment of detection of stuck-at and open IO interconnection faults. In some embodiments, open fault detection may also be utilized to detect stuck-at faults, as provided in FIG. 6. In this illustration, the path under test may be established by closing the switches on the functional path (switch 630 of transmitter 605 and switch 640 of receiver 610) and leaving all other switches open (switch 635 of transmitter 605 and switch 645 of receiver 610). While switch functions in FIG. 6 other figures are illustrated as particular switches (switches 630, 635, 640, and 645 in FIG. 6), the switch functions may be implemented in other forms or locations in a system. If transmitted test patterns 650 are successfully recovered at the receiver 610 or if the transmitted signal 650 is detected by the signal detector 625, then the system concludes that no open or stuck-at faults have been detected. However, if the transmitted test pattern is not received and the signal pattern is not detected, such as because of open circuit 655, then an error is detected, such as by error detector 620.

If, for example, open/stuck-at faults on the positive interconnection wire are to be targeted, all the switches on the positive interconnection wire are closed and all others are opened by providing the switch control input of txc[t,1:0]^rxc [r, 1:0]='0101' to all links under test. In this example, presence of faults will prevent the input test patterns from being propagated and thus such test patterns will not be recovered at the receiver. With a complementary switch setting (i.e. txc[t, 1:0]^rxc[r, 1:0]='1010'), the same test may be repeated to detect open/stuck-at faults on the negative interconnection wire of all links under test. In this illustration, the test configurations for the open test are '0101' and '1010'.

Figure 7:
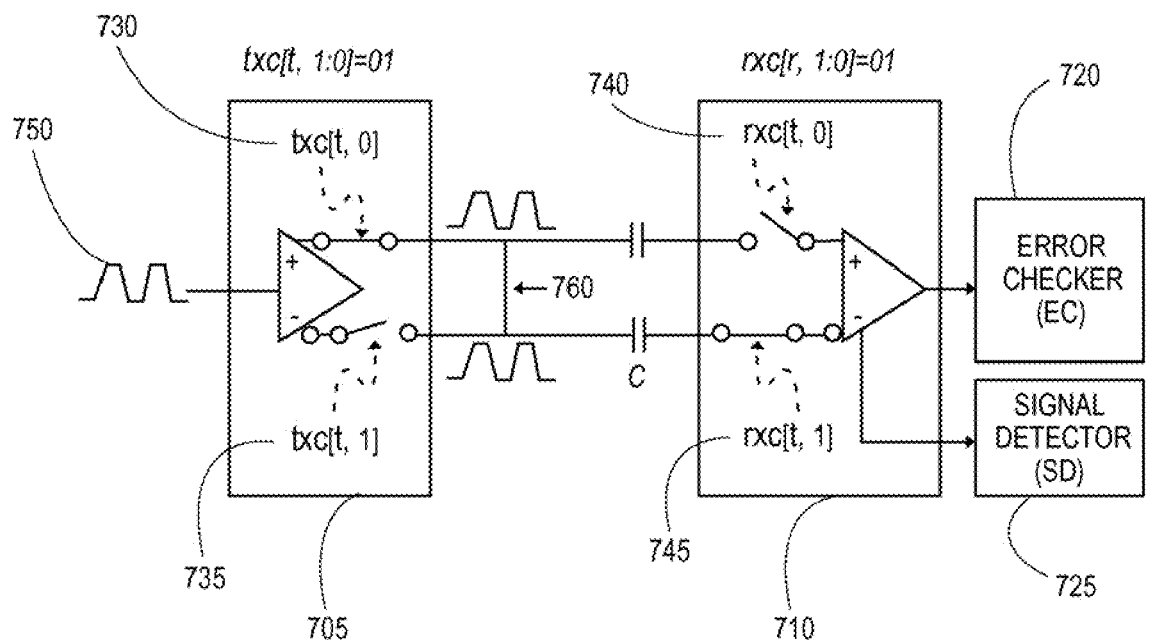
FIG. 7 is an illustration of an embodiment of detection of bridging faults.

In some embodiments, a bridging test may be carried out as illustrated in FIG. 7 for a transmitter 705 and a receiver 710, which may be coupled with an error checker (EC) 720 and a signal detector (SD) 725. In this illustration, the test path to excite targeted bridging faults may be established with the switch control input of txc[t,1:0]^rxc[r,1:0]='0110' or '1001' for all links under test. For example, switch 730 of transmitter 705 and switch 745 of receiver 710 may be closed, and switch 735 of transmitter 705 and switch 740 of receiver 710 may be open. In a fault-free situation, all paths are opened and no signal is propagated from the transmitter 705 to the receiver 710, and thus test pattern 750 should not be detected by signal detector 725. If, however, a bridging fault, such as fault 760, resides between any interconnection wires, the complemented test pattern or waveform may be received through the path set via the bridging fault. If the complemented test pattern is received at the receiver 710, a bridging fault is detected. Detection and diagnosis of complex multiple bridging faults are discussed further below.

In some embodiments, a test structure or system may be employed to test HSIO interconnections that involve either a conventional transmitter or receiver that is not equipped with elements of the testing system. This capability may be utilized to allow for extending the test benefit to the devices that are not equipped with test structure elements. For example, testing structures may be utilized when only one of communicating transmitter and the receiver is equipped with the test structure.

Figure 8:
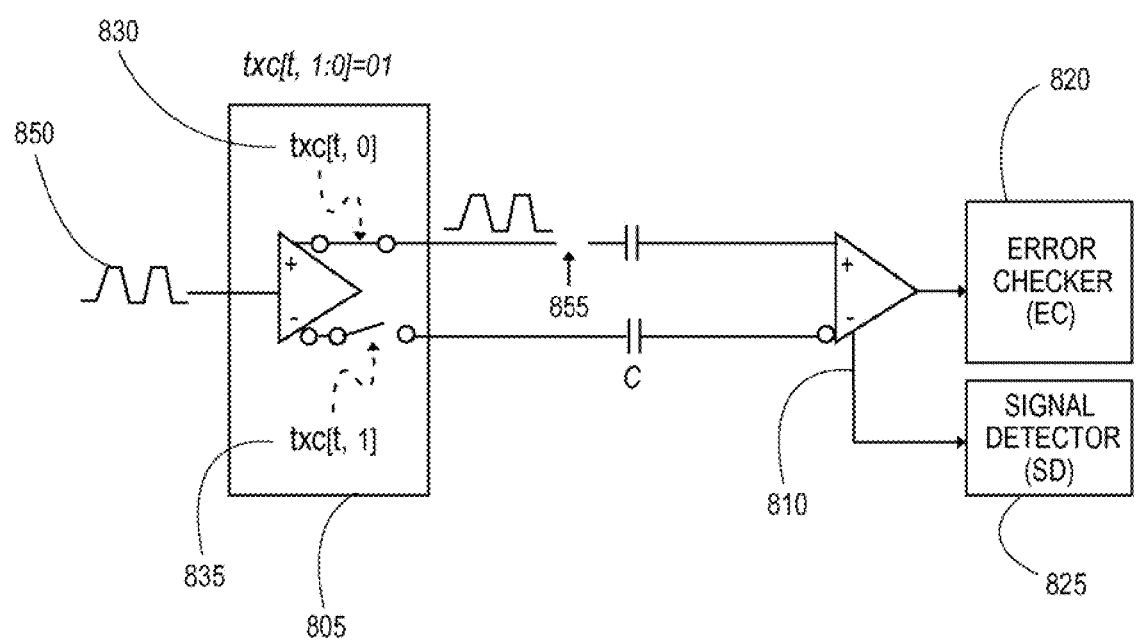
FIG. 8 is an illustration of an embodiment of open fault detection for a system including a transmitter in communication with a conventional receiver.
Figure 9:
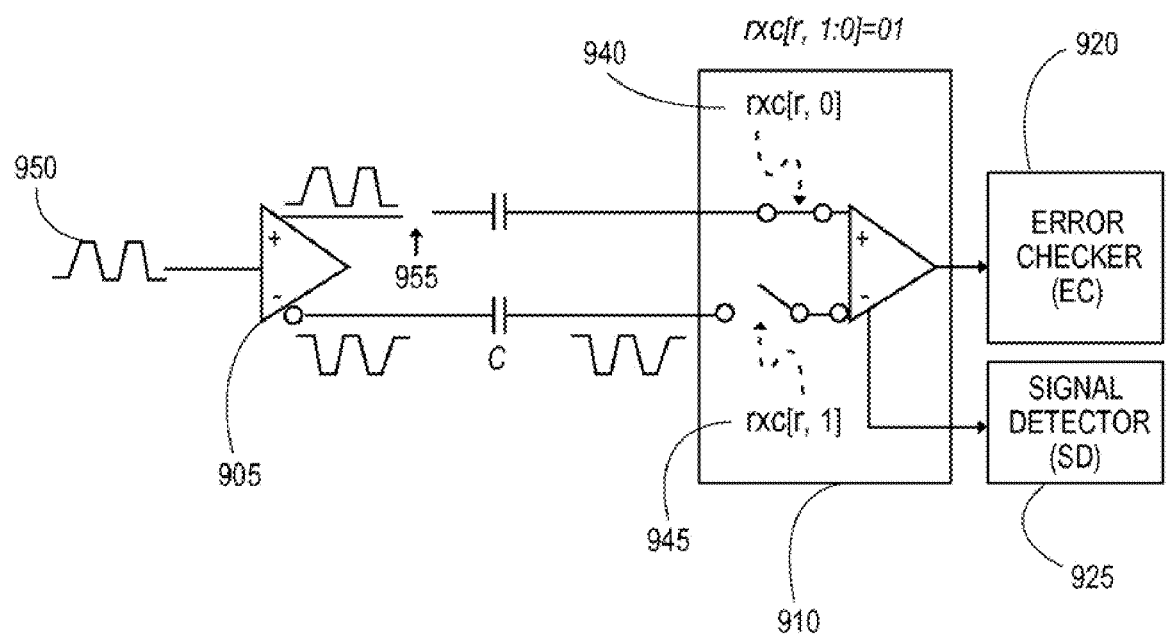
FIG. 9 is an illustration of an embodiment of open fault detection for a system including a receiver in communication with a conventional transmitter.

FIG. 8 is an illustration of an embodiment of open fault detection for a system including a transmitter in communication with a conventional receiver, and FIG. 9 is an illustration of an embodiment of open fault detection for a system including a receiver in communication with a conventional transmitter. As examples shown in FIGS. 8 and 9 illustrate, a transmitter or receiver equipped with a test structure may be integrated with a conventional counterpart to form a HSIO link. In these configurations, the interconnection test may similarly be carried out for open and stuck-at faults. In some embodiments, multiple bridging faults among interconnection wires may also be detected. For example, if one test pattern source is bridged to many test pattern sinks, the multiple bridging faults may be detected as an open fault because the amplitude of test pattern waveform may be divided by the number of pattern sinks, and hence the test pattern may not be recovered or detected.

FIG. 8 illustrates an embodiment of open fault detection in which a transmitter 805 is enabled for fault detection, including switches 830 and 835, while the error detector 820 and signal detector 825 included in the receiver 810 are enabled for fault detection. The detection of, for example, open fault 855, may include closing switch 830 and opening switch 835. When test pattern 850 is applied to the transmitter 805 in this configuration no signal will be detected at the receiver 810 by signal detector 825, indicating a fault condition. (The conventional RX depicted in FIG. 8 may be considered as a special case of RX in FIG. 5 with all switches in the RX being permanently closed.)

FIG. 9 illustrates an embodiment of open fault detection in which a receiver 910, which includes the error detector 920 and signal detector 925 is enabled for fault detection, including switches 940 and 945, while the transmitter 905 is constantly providing test pattern waveforms to both the negative and the positive interconnection wires for fault detection. The detection of, for example, open fault 955, may include closing switch 940 and opening switch 945. When test pattern 950 is applied to the transmitter 905 in this configuration no signal will be detected at the receiver 910, indicating a fault condition. (The conventional TX depicted in FIG. 9 may be considered as a special case of TX depicted in FIG. 5 with all switches in the TX being permanently closed.)

When a number of transmitters and receivers are connected on the same board, fault detection and diagnostics may not be a trivial task. The connected transmitters and receivers may potentially interfere with each other. Faults, especially multiple faults among interconnection wires, may complicate analysis of faulty behavior and may make diagnostic more challenging. In applying a test pattern for fault detection, some bridging faults, for example, may be masked or may change an amplitude of an input signal waveform. In some embodiments, a test process is applied to detect and locate multiple faults, which may assist not only in volume ramp up for production, but also in troubleshooting.

In some embodiments, a test system or method is implemented to detect and to locate multiple interconnection faults. In some embodiments, the test system or method may reduce undesirable complications by enabling one test pattern source and one test pattern sink at a time during each run of the test. In this implementation, an aim is to isolate or divide a potentially complicated pattern of multiple faults into a simpler pattern of faults utilizing tests for the pattern source and the sink. In some embodiments, detection of a simpler pattern of faults from each test run may be collected to reconstruct the original pattern of multiple faults.

In signal communications, clock signals may be embedded into the stream of data, or may be provided separately. In a case of source synchronous HSIO, where the differential clock links are provided separately, an available signal detector may be used for the clock link. If the signal detector is not available, then a counter may be employed to detect the faults on the clock links. In this implementation, the counter is incremented if the clock is recovered.

In some embodiments, for fault diagnosis, the clock links may be tested separately from the data links. For example, the clock links may be tested first and the data link may be tested second. In this implementation, the test procedure for the clock may be the same as for the data links, except that the counter may be employed instead of the functional BIST to detect faults on the clocks. Because embodiments of test procedures may be applied to test both the clock and the data links, the discussion herein may address a system in terms of the data links to address both tests.

An embodiment of a test procedure is provided below in Table 1. An embodiment of a test may separate a stuck-at test from an open and bridging test for improved diagnostic resolution. In some embodiments, a switch-short and stuck-at test may be utilized to locate faulty switches and stuck-at faults that are observed at the receivers, and an open and bridging test may detect and locate open and bridging faults.

TABLE 1

Test Procedure
Proposed HSIO interconnection test procedure

Begin
   HSIO interconnection test {
      Perform "switch-short and stuck-at test";
      Perform "open and bridging test";
   }
End In some embodiment, a switch-short and the stuck-at test procedure may be performed by all links or connected pairs of transmitter and receiver in parallel. For the test, the input test patterns may be chosen to aid the data recovery at the receiver. For the purpose of the illustration provided here, an assumed test pattern may be '1010 . . . 10' or '0101 . . . 01'. This test pattern contains maximum transitions for detection of faults in one of the differential interconnections. Other test patterns may be substituted or added in other implementations.

In some embodiment, a test path may be established according to the control values of txc[r,1:0] and rxc[r,1:0] applied to the test structure. Once a test path is established by the proposed test structure, the test patterns may be transmitted and received through the controlled test path. The received test patterns may be checked for error and the signal detector may sense presence of the AC signal. The results of error and signal detection may be exported for a test decision. The recovered test pattern may be exported for a test and diagnosis decision.

An embodiment of a switch-short and stuck-at test procedures is illustrated in Table 2:

TABLE 2

Switch-short and stuck-at test procedures
Switch-short and stuck-at test procedure

```
switch-short and stuck-at test {
    test_patterns = (101010...10, other patterns); // Set of input test patterns
    controls = (0010, 0001, 1000, 0100); // values of txc[1:0]ˆrxc [1:0]
    for (i=0; i<|controls|; i++;) { // |controls| = 4
        for all r in TX[r] and RX[r] , do in parallel {
            txc[r, 1:0]ˆrxc[r, 1:0] = controls[i][3:0]; // test configuration
            for ( k=0; k<|test_patterns|; k++;) { // |test_patterns| = 1 or greater
                bist_error[r] = 0; error[r] = 0;
                for ( m=0; m<M−1; m++;) {
                    transmit_and_receive (TX[r], RX[r], test_patterns(k));
                    // Short-switch and stuck-at diagnostics
                    stuck-at_1[r] = (received[r] == 111...111);
                    stuck-at_0[r] = (received[r] == 000...000);
                    switch_short[r] = (received[r] == test_patterns(k)]);
                    bist_check[r] = switch_short[r] \ stuck-at_1[r] \stuck-at_0[r];
                    bist_error[r] = bist_check[r] \ bist_error[r];
                    error[r] = (bist_error[r] \ signal_detected[r]) \ error[r]; }
                if (error[r]) {
                    if (switch_short[r]){ report switch-short fault (r, controls); }
                    else if (stuck-at_1[r]){ report stuck-at-1 fault in (r,
                        controls); }
                    else if (stuck-at_0[r]){ report stuck-at-0 fault in (r,
                        controls); }
                    else { report signal detected in RX[r];} }
                else { report no switch_short or stuck-at faults detected in
                    RX[r]; }
}}}
}
transmit_and_receive (TX[t], RX[r], test_pattern) {
    transmit[t] (test_pattern);
    received[r] = receive[r] (test_pattern);
    signal_detected[r] = detect_signal[r] (test_pattern);
}
```

In Table 2, symbols ==, | and |A| denote logical equality, logical OR, and number of elements in set or list A, respectively. In some embodiments, stuck-at_1[r] and stuck-at_1[r] may be checked off-line. In such case, bist_check[r] may be determined by switch_short[r].

Figure 10:
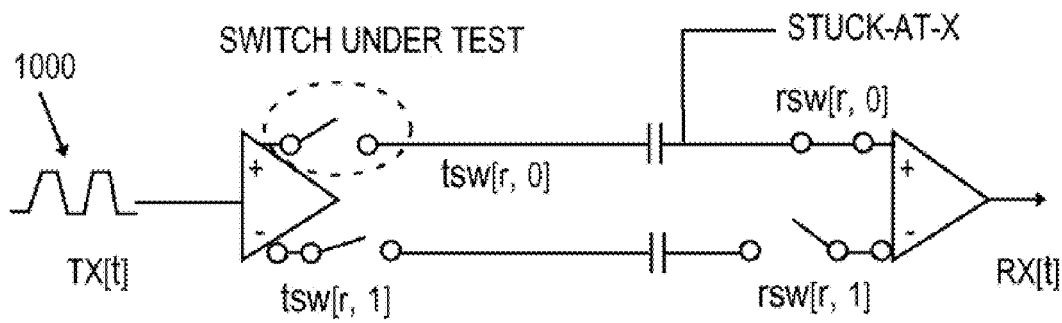
FIG. 10 is an illustration of an embodiment of switch-short and stuck-at detection.
Figure 10:
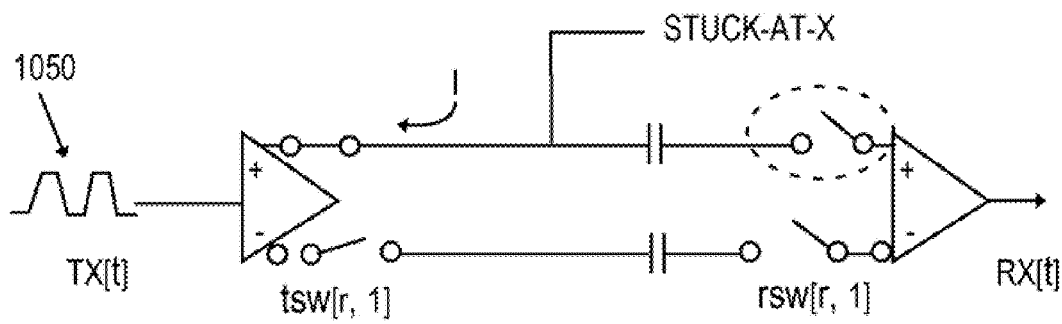

In some embodiments, a set of control values for a targeted test may be applied to the test structure one at a time. In some configurations, there may be four test configurations for the switch-short and the stuck-at test. In an implementation, a set of 4-bit switch control values are assigned to an array variable denoted as "controls". Thus, the controls[i][3:0] for 0≦i≦3 would provide the i-th control value to txc[t,i1:0] and rxc[r, 1:0]. As the for-loop in the test procedure provided in Table 2 unfolds, each value of controls[i][3:0] is provided to the test structure in order to configure the test path. FIG. 10 is an illustration of an embodiment of switch-short and stuck-at detection. In the example illustrated in FIG. 10, the controls [0]='0100' and the controls[2]='0001' may be provided to establish the test paths for the tsw[r,0], as shown in configuration 1000 and configuration 1050 of FIG. 10 respectively. In the same path, the stuck-at fault on the interconnection wire connected to the receiver may also be tested. Further, the stuck-at fault shown in configuration 1050 of FIG. 10 may be detected as an open fault because the AC-coupling capacitor blocks any DC signal.

In some embodiments, after a test path is established, a test pattern may be transmitted and checked at the receiver. Transmission and data recovery that is assumed in some embodiments are briefly summarized in the transmit-and-receive sub-procedure. Each test pattern is transmitted M times by the transmitter. The transmitted test pattern is recovered at the receiver if the transmission is successful. The recovered pattern saved in the received[r] may then be checked to detect stuck-at-1, stuck-at-0, and the switch-short faults. For example, if the receiver[r] detects a stream of ones or zeros, then the interconnection may be determined to be stuck-at-1 or stuck-at-0. If, however, the input test pattern is received, it may be determined that the tsw[t,0] is defective. By checking the recovered test pattern at the receiver, the defective switch may be identified.

A signal detector may also detect a presence of an AC signal when the test pattern is being transmitted. If the signal detector detects a signal, the detector may assert the signal detected to logical 1 which may result in the error[r]=1.

The total error[r] may be used to flag an error if the BIST detects at least one match or the signal detector detects an AC signal. A test path that contains faults mat be identified with the test configuration provided in the controls[i][3:0]. If, for example, the error[r] is produced in the test path established by the controls[2][3:0]='0100', then the interconnection wire may be stuck-at-x or the tsw[r, 0] may be defective.

Note that in the described circumstances a switch stuck-open fault may be detected but not distinguished from an open fault on the same interconnection wire. Thus, a switch-open fault may be determined to be an open fault on the interconnection wire at the board-level. This may decrease the board-level yield in production because the faulty device may cause a good board to fail the test. In some embodiments, the switches in the test structure may be assumed to be fault-free, or at least free from the switch-open fault. It may be assumed, for example, that the switches are tested at the device level before assembly. The purpose of switch-short test then is to revalidate the critical function of test structure for the targeted interconnection test in order to ensure the test quality. This is done because the switch-short may cause a defective board to pass.

In some embodiments, the stuck-at test may be overlapped with the switch-short test for improved diagnostic resolution. The stuck-at fault shown in configuration 1050 of FIG. 10, whose propagation is blocked by the AC-coupling capacitor, may also be detected as an open fault. This may decrease the diagnostic resolution in that one fault may be recognized as the other. In some embodiments, however, the diagnostic resolution may be improved for the faults that are analyzed at the transmitter by employing test methods based on sensing current or voltage commonly used in the DC-coupled interconnection, as mentioned above. In this example, the stuck-at-1 and stuck-at-0 may cause the DC current I to flow into and out of the transmitter, respectively.

In some embodiments, after the switch-short and stuck-at test, the open and bridge test may be initiated. Because the stuck-at faults, if any, were identified in the previous test, the stuck-at fault detection during the open and bridging test is not discussed. The test paths to detect open faults and bridging faults may coincide with the functional path and non-functional path respectively. Thus, if the test path were established through the functional path, the open fault is targeted. Otherwise, the bridging fault is targeted.

Figure 11:
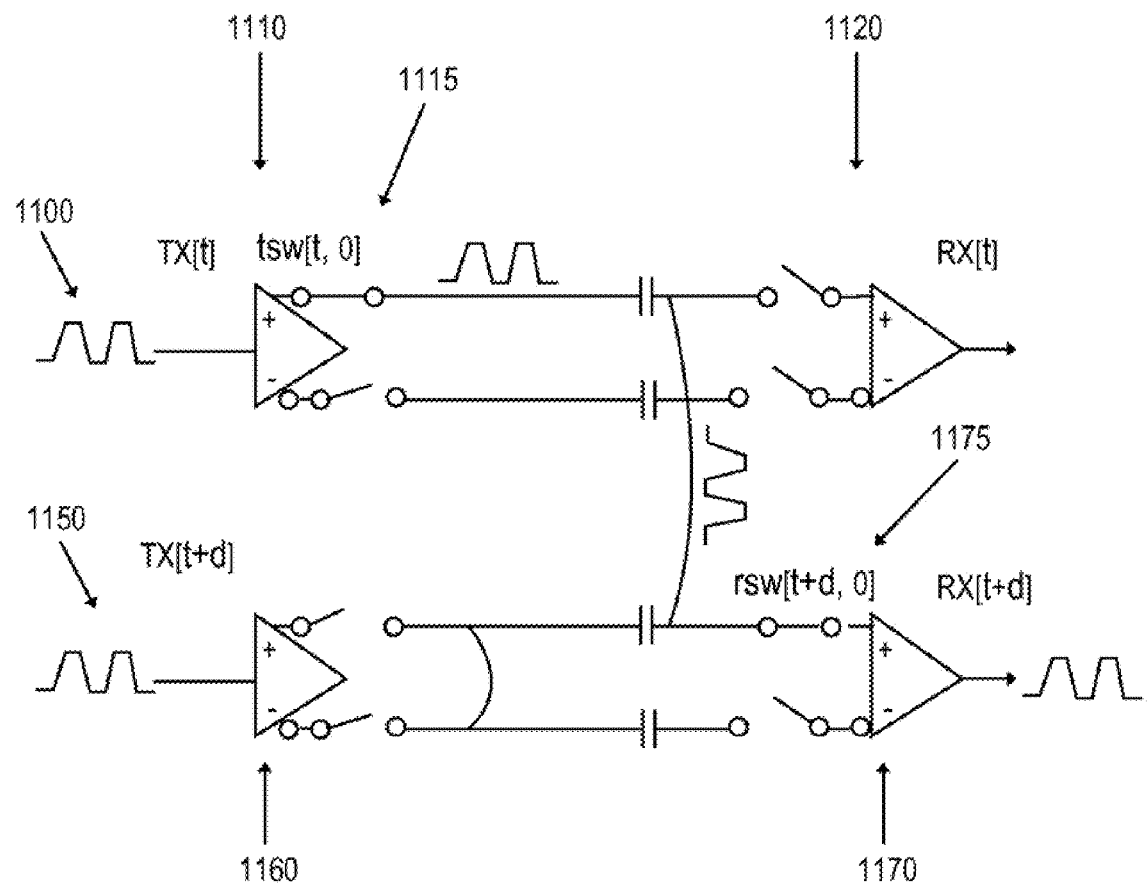
FIG. 11 is an illustration of an embodiment of bridging detection.

FIG. 11 is an illustration of an embodiment of open and bridging detection. As illustrated, open, and bridging fault detection is provided for wires with the same polarity in a serial test environment utilizing the test algorithm presented in Table 3. FIG. 11 is an illustration of an embodiment of bridging fault between the link[t] (1100) and the link[t+d] (1150), where 0<t+d<N. In this illustration, it may be assumed that there are N serial links or N transmitter-receiver pairs, such as circuit 1100 having transmitter 1110 paired with receiver 1120, and circuit 1150 having transmitter 1160 paired with receiver 1170. In an embodiment, any one of multiple test pattern sources and test pattern sinks may be enabled and all other test pattern sources and sinks are disabled. For example, transmitter 1110 may receive signal 1100 and transmitter 1160 may receive signal 1150. In an illustration of embodiment depicted in FIG. 11, the test pattern source in the transmitter 1110 may be enabled via the switch 1115 and the test pattern sink in the receiver 1170 may be enabled via the switch 1175. The switches in all other (N−2) links that are not shown in FIG. 11 are disabled or opened. In an example, a test path may be established by closing the switches tsw[t, 0] (such as switch 1115) and rsw[t+d,0] (such as switch 1175) and leaving all other switches open. One test pattern source and sink may be enabled during the open and bridging test in order to isolate the complex multiple faults into a set of defective test pattern source and sink pairs. For each test pattern source, the test may be run by enabling one test pattern sink at a time. Thus, there are $N^2$ number of test configurations to complete diagnosis of open faults, stuck-at and bridging including crosstalk. The complexity of the test for diagnosis may be referred to as $O(N^2)$, where N is the number of links (transmitter and receiver pairs) on the board under test. In a circumstance in which diagnosis is not of concern (i.e., the determination of the existence of a fault is sufficient), the tests may be run in parallel. The proposed parallel test targeted for manufacturing is discussed further below. The total, open, and bridging test paths may be summarized as follows. Note that the test paths included in the open test paths will coincide with the functional paths.

Total={(tsw[t,i], rsw[r,j])|(0≦t<|TX|) & (0≦r<|RX|) & (0≦i,j≦1)}

Open=Total ∩ {(tsw[t,i], rsw[r,j])|(t=r) & (i=j)}

Bridging=Total−Open

The symbols |TX| and the |RX| denote number of transmitters and of receivers, respectively. The total, open, and bridging test paths related to the test pattern source enabled by the set {tsw[t,i]} may be defined using the projection operator ↑ as follows:

Total ↑{tsw[t,i]}={(tsw[t,i], rsw[r,j])|(0≦r<|RX|) & (0≦j≦1)}

Open ↑{tsw[t,i]}={(tsw[t,i], rsw[t,i])}

Bridging ↑{tsw[t,i]}=Total↑{tsw[t,i]}−Open↑{tsw[t,i]}

In some embodiments, a set of test paths related to any set of test pattern sources may be defined similarly. As an example, it may be assumed that there are two serial links or two transmitter-receiver pairs as shown in FIG. 11, such as circuits 1100 and 1150. The total, open, and bridging test paths related to the signal source enabled by the tsw[t,0] for t=0 and d=1 may be as follows:

Total↑{tsw[0,0]}={(tsw[0,0], rsw[r,j])|(0≦r,j≦1)}

Open↑{tsw[0,0]}={(tsw[0,0], rsw[0,0])}

Bridging↑{tsw[0,0]}={(tsw[0,0], rsw[0,1]), (tsw[0,0], rsw[1,0]), (tsw[0,0], rsw[1,1])}

Total↑{tsw[0,0]}=Open↑{tsw[0,0]}∪Bridging↑{tsw[0,0]}

Thus, for the test pattern source enabled by the tsw[0,0], the test paths in the Total↑{tsw[0,0]} shown above may be tested one at a time. The test may continue until all four of the test pattern sources are tested with respect to all four test pattern sinks.

In some embodiments, the open test path may be established in the functional path. It may be established by enabling the switches tsw[t,i] and rsw[t,i] for all t and i. The test patterns may then be provided from the source and a check may be provided to determine whether the test patterns are received at the sink. If no test pattern is detected at the enabled sink, an open fault between the source and the sink is detected. Similarly, the bridging test paths may be specified by the enabled switches tsw[t,i] and rsw[r,j], where (t≠r) or (i≠j). Note that the bridging test paths are non-functional paths. The test pattern transmitted to a non-functional path should not be received in any receivers if the interconnections are fault-free. If, however, the transmitted test pattern is received at any pattern sink, a bridging fault between the pattern source and the sink may be detected.

The bridging faults in FIG. 11 may be detected in the test paths (tsw[t, 0], rsw[t+d, 0]) and (tsw[t+d, 0], rsw[t, 0]). The test paths (tsw[t+d, 1], and (tsw[t+d, 1], rsw[t+d, 0]) may also verify the existence of multiple faults. In some embodiments, by combining the results of individual tests, a complete topology of multiple bridging faults may be constructed. This process may be viewed as projecting multiple bridging faults to each individual test path, which may be viewed as analogous to what Fourier analysis does with a complex signal. For example, if a detected fault could be identified with the test path from which the fault was detected, the collected test results for the multiple bridging faults in FIG. 11 may be summarized as follows, where DET indicates a set of detected faults:

$$DET = \{(\text{bridging fault, } (tsw[t, 0], rsw[t + d, 0])),$$
$$(\text{bridging fault, } (tsw[t + d, 0], rsw[t, 0])),$$
$$(\text{bridging fault, } (tsw[t + q, 0], rsw[t + d, 1])),$$
$$(\text{bridging fault, } (tsw[t + d, 1], rsw[t, 0])),$$
$$(\text{bridging fault, } (tsw[t + d, 1], rsw[t + t + d, 0]))\}$$

If a schematic of board design is available in electronic form in an EDA (Electronic Design Automation) tool, the multiple faults may be reconstructed from the detected faults collected in the DET and the reconstructed multiple bridging faults can be highlighted on the board schematic.

In some embodiments, if only bridging faults are presented, test paths that detect the same bridging fault would be symmetrical. If, for example, the bridging fault may be detected at the test path (tsw[t, 0], rsw[t+d, 0]), then it would be expected that the same bridging fault should also be detected at the path (tsw[t+d, 0], rsw[t, 0]). If the symmetry is broken or one of the symmetric test paths is missing from the DET, this may imply that the test path includes additional open faults (or stuck-at faults observed as open as discussed with regard to FIG. 10), preventing the bridging fault being detected.

In some embodiments, asymmetric detection of bridging faults may be utilized to identify the location of open faults relative to the detected bridging faults. If, for example, the (bridging, (tsw[t+d,0], rsw[t,0]))∈DET and (bridging, (tsw[t, 0], rsw[t+d,0]))∉DET, then an open fault is detected between the tsw[t,0] and the bridging fault in the test path (tsw[t, 0], rsw[t+d, 0]). The open fault may be detected in the test path (tsw[t, 0], rsw[t, 0]). Thus, the existence of the following detected sub-fault list L(t,0) ⊂ DET may be used to locate the open in presence of bridging fault. L(t,i) denotes a detected sub-fault list that may be used to identify the open fault between tsw[t,i] and the bridging fault or the open fault located left of the bridging fault:

L(t,0)={(open, (tsw[t,0], rsw[t,0])), (bridging, (tsw[t+d,0], rsw[t,0]))}

Similarly, if the opposite is true, then the location of an open fault may be detected between the test pattern source and the (bridging, (tsw[t+d, 0], rsw[t, 0])). The following sub-fault list L(t+d,0) ⊂ DET may be used to locate the open fault in the presence of bridging faults:

L(t+d,0)={(open, (tsw[t+d,0], rsw[t+d,0])), (bridging, (tsw[t,0], rsw[t+d,0]))}

Open faults between a bridging fault and a test pattern sink may similarly be located from the sub-fault lists R(t,0) and R(t+d,0) ⊂ DET. R(r,j) denotes a detected sub-fault list that may be used to identify the open fault between the bridging fault and the rsw[r,j] or the open fault located right of the bridging fault:

R(t,0)={(open, (tsw[t,0], rsw[t,0])), (bridging, (tsw[t,0], rsw[t+d,0]))}

R(t+d,0)={(open, (tsw[t+d,0], rsw[t+d,0])), (bridging, (tsw[t+d,0], rsw[t,0]))}

In some embodiments, the difference between L(t,i) and R(r,j) is the test path for the bridging fault that is observed or detected.

In some embodiments, a test procedure for detecting open and bridging faults may be summarized as shown below in Table 3. The first block of for-loops configures the test path by enabling one source and one sink at a time. For each constructed test path, a test pattern '1110 . . . 10' or other test patterns may be applied in order to locate the open and bridging faults. In Table 3, symbols !=, ! and ⊕ denote logical inequality, logical negation and logical XOR respectively. Using logical XOR, the bit-wise complement of test pattern can be denoted as 'test_pattern ⊕1'.

TABLE 3

Open and Bridging Test Procedures
Proposed open and bridging test procedures

```
Open and bridging test {
test_patterns = (101010...10, other patterns);
// Configuring the test path
for (t=0; t<|TX|; t++;) { // |TX| = N
  for (i=0; i<2; i++;) {
    for (r=0; r<|RX|; r++;) {
      for ( j=0; j<2; j++;) {
        test_path = ( tsw[t, i], rsw[r, j] );
        // Assuming that there are more than one test pattern
        bist_error[r] = 0; error[r] = 0;
        for ( k=0; k<|test_patterns|; k++;) { // |test_patterns| = 1 or
        greater
          for ( m=0; m<M-1; m++;) {
            transmit_and_receive ( TX[t], RX[r], test_patterns(k) );
            // Detection & location of open faults on the functional paths
            // Stuck-at faults can also be detected & located
            if ( (t == r) & (i ==j) ) {
              bist_check[r] = (received[r] != test_patterns(k) );
              signal_check[r] = (! signal_detected[r] );
              fault_type = open; }
            // Detection of bridging faults
            // (1) Bridging between interconnection wires with the same
            polarity
            else if ( (t!=r) & (i == j) {
              bist_check[r] = (received[r] == test_patterns(k) );
              signal_check[r] = signal_detected[r];
              fault_type = bridging; }
            // (2) Bridging between complementary interconnection wires
            else if (i !=j) {
              bist_check[r] = (received[r] == test_patterns(k) ⊕ 1 );
```

TABLE 3-continued

Open and Bridging Test Procedures
Proposed open and bridging test procedures

```
              signal_check[r] = signal_detected[r];
              fault_type = bridging; }
            // Accumulating errors for all test patterns applied to each test
            path
            bist_error[r] = bist_check[r] | bist_error[r];
            error[r] = ( bist_error[r] | signal_check[r] ) | error[r]; } }
          if (error[r]) { report "Fault detected: ( $fault_type,
          $test_path )"; }
}}}
}
```

The open faults may be tested through the functional path (tsw[t, i], rsw[r, j]) where (t=r) & (i=j). The variable fault_type may be utilized to keep track of the type of fault detected. If an open fault is detected, the open fault is be assigned to the fault_type. The test result may be collected in the form of (fault_type, test path)∈DET indicating that the fault type detected in the corresponding test path.

The set of test paths that detect the bridging faults may similarly be obtained as {(tsw[t,i], rsw[r,j])|(i≠j) or (t≠r)}. The test paths specified by (t≠r)&(i=j) and by (i≠j) may be used to detect a bridging fault between interconnection wires with the same polarity as shown in FIG. 11, and between complementary wires.

In order to cope with issues including price competitiveness, system board manufacturers have increased efforts to integrate more system functions into a smaller board. However, the board design effort intended to achieve this integration goal unfortunately results in reduced interconnection wire dimensions and tighter routing constraints on interconnection wires, which may worsen crosstalk between nearby interconnection wires. The signal integrity problem caused by crosstalk may increase jitter, which then may make data recovery at a receiver difficult. Because detection and analysis of crosstalk is cumbersome in general, availability of test methods that may locate sources of crosstalk may be critical in volume ramp up and in validation of system boards.

Figure 12:
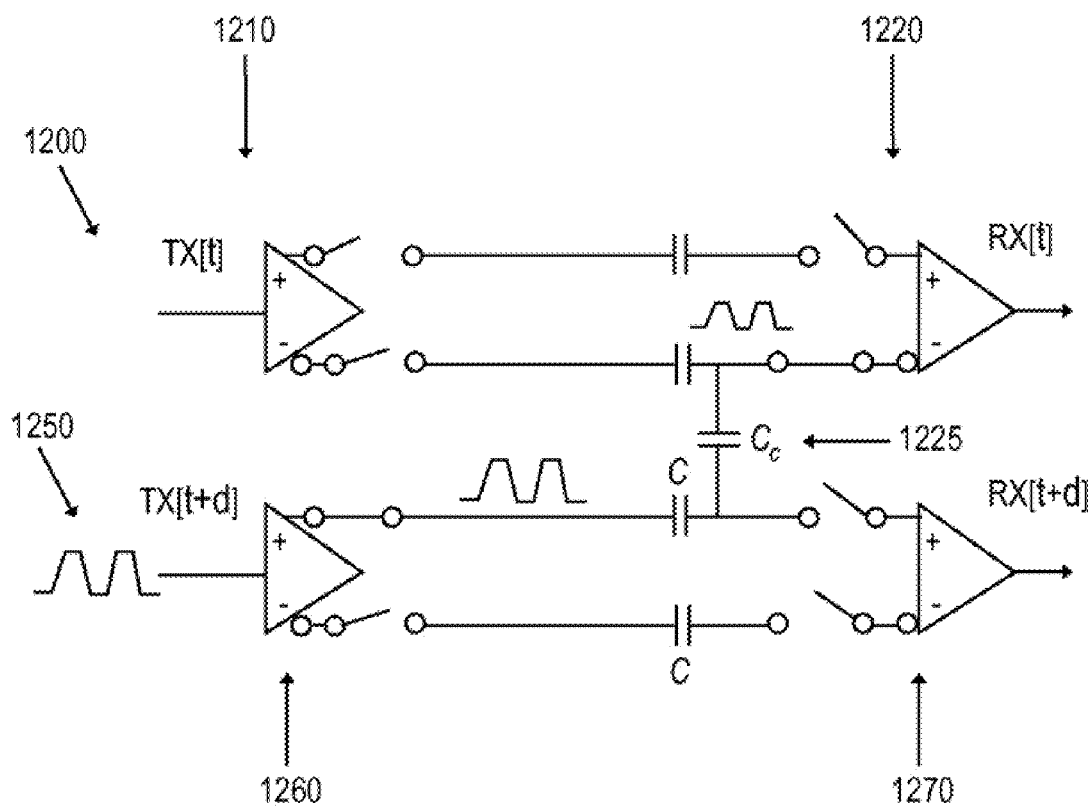
FIG. 12 is an illustration of an embodiment of a system for detection of crosstalk.

In some embodiments, a test method for bridging, as described above, may be applied to locate crosstalk between the HSIO interconnections. FIG. 12 is an illustration of an embodiment of a system for detection of crosstalk, such as between circuit 1200, from transmitter 1210 to receiver 1220, and circuit 1250 from transmitter 1260 to receiver 1270. The crosstalk may modeled by replacing a bridging fault with a coupling capacitor 1225 as example shown between circuit 1200 and circuit 1250 in FIG. 12. The coupling capacitor 1225 denoted as $C_c$ is provided to model the coupling noise induced by the crosstalk. The coupling noise may be considered as a general case of bridging fault because the effect of a bridging fault may be approximated with $C_c=\infty$.

In some embodiments, the test procedure described above may be employed to locate crosstalk. If a test pattern is applied from the TX[t+d] through the test path (tsw[t+d,0], rsw[t,1]), then crosstalk may result if the $C_c$ is large enough. When the test path is established, the test path may become AC-coupled with the capacitors, $C_c$ and C, in series. Since $C_c \ll C$ is generally assumed, the total capacitance of AC-coupled test path may be dominated by the $C_c$. If the $C_c$ is large enough, the input test pattern may be transmitted through the test path and may be detected at the sink by a signal detector or an error checker.

In some embodiments, because the amplitude of coupling noise depends on frequency and amplitude of test waveform, the maximum amplitude of test waveform '1010 . . . 10' (or '0101 . . . 01') that provides the maximum frequency may be employed for a crosstalk test. In some embodiments, amplitude of the test waveform may be amplified by equalization. Equalization is a system function that boosts the signal amplitude in every signal transition. Alternatively, the amplitude of the same test waveform may be increased by a desired amplification factor. An amplification factor may be determined from the signal detector threshold and the crosstalk threshold. For example, if the signal detector threshold is 50 mv and the crosstalk threshold is 40 mV, the input test waveform may be amplified up to the point where the undesirable coupling noise may be detected at the signal detector.

In some embodiments, because the same test procedure may be applied to the detection of crosstalk and of bridging fault, the crosstalk is targeted during the bridging test. This may be carried out by calibrating the amplitude of input test waveform to excite the coupling faults. To distinguish the crosstalk from the bridging fault, more detailed analysis may be carried out by reducing the amplitude and/or the number of transitions in the input waveform. As described above, coupling noise depends on the amplitude and number of transitions of the input test waveform (i.e., frequency) and may fade out when these factors are reduced. Thus, if an error disappears after reduction of the amplitude and number of transitions, then coupling noise may be concluded. However, if the error persists despite these signal modifications, a bridging fault may be concluded, within some margin of error.

In some embodiments, for the purpose of fault detection, a fault test may be performed by all of transmitters and the receivers in parallel. The parallel test approach may provide test cost savings due to the reduced test time. An example of a parallel test for open faults and bridging faults is provided in Tables 4 and 5, respectively. The parallel test is assumed to be carried out after the stuck-at test, as described above.

TABLE 4

Parallel Open Test Procedure
Parallel open test procedure

```
Open test {
    test_pattern = 101010...10;
    controls = (1010, 0101); // controls[1] = 1010 and controls[0] = 0101
    for (i=0; i<|controls|; i++;) { // |controls| = 2
        for all r in the link[r] = (TX[r], RX[r]), do in parallel {
            txc[r, 1:0] ^ rxc[r, 1:0] = controls[i][3:0];
            bist_error[r] = 0; error[r] = 0;
            for (m=0; m<M-1; m++;) {
                transmit_and_receive (TX[r], RX[r], test_pattern);
                bist_error[r] = (received[r] != test_pattern ) | bist_error[r];
                error[r] = bist_error[r] | (! signal_detected[r] ) | error[r];
                if (error[r]) { report (open, (r, controls[i])); }}}
}
```

Figure 13:
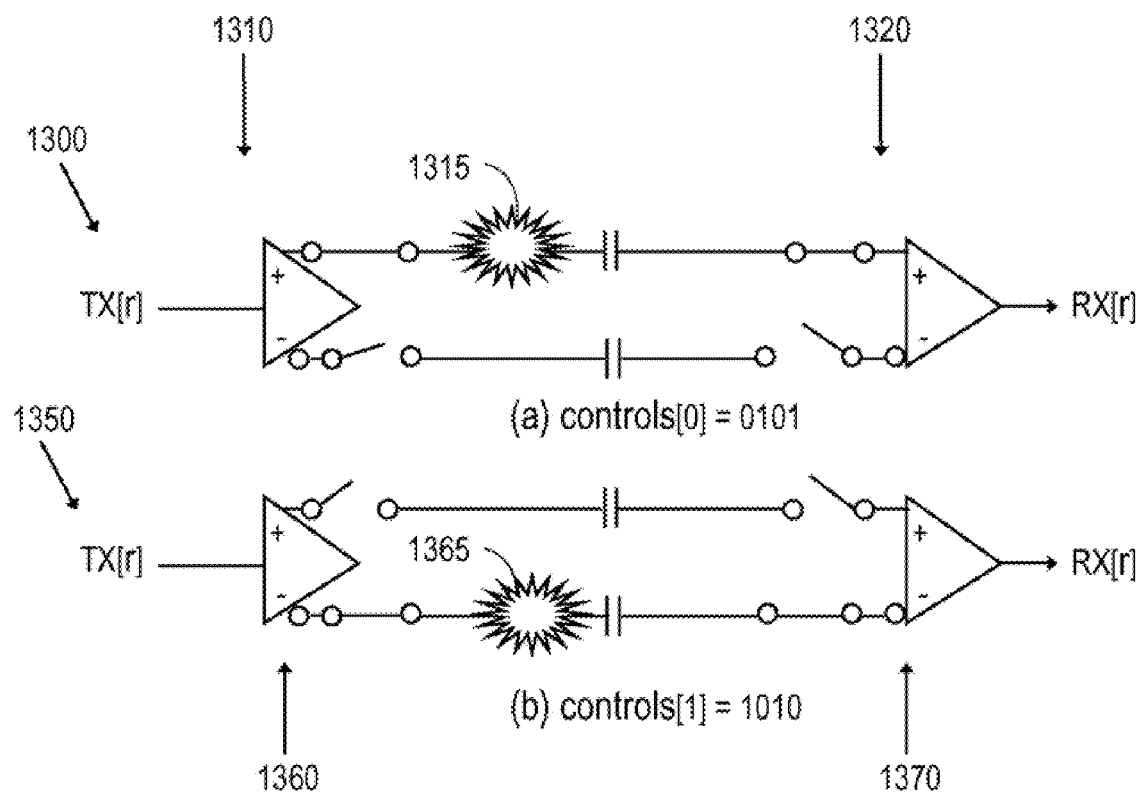
FIG. 13 illustrates an embodiment of open fault detection.

In the parallel open test procedure, the test pattern of '101010 . . . 10' is assumed. There may be two test paths established by the switch control inputs provided in the controls. The same control input may be provided to the txc[r,1:0] and the rxc[r,1:0] for all r. FIG. 13 illustrates an embodiment of open fault detection. FIG. 13 illustrates circuit 1300 from transmitter 1310 to receiver 1320 and circuit 1350 from transmitter 1360 to receiver 1370. In the example shown in FIG. 13, the controls[0][3:0] or controls[0]='0101' (or controls [1]='1010') may be utilized to establish the test path to detect an open fault on the positive (or negative) interconnection wires. In this illustration, open fault 1315 is shown on a positive interconnection of circuit 1300, and open fault 1365 on a negative interconnection of circuit 1350. Because the open test may run on the functional path, an error may be detected if the transmitted test pattern is not received, or if no AC-signal is detected at the receiver. The error may be in the form of (fault_type, (r, controls[i])). The test path (tsw[r,i], rsw[r,i]) is equivalent to (r, controls[i]) because the controls[i] turns on the switches tsw[r,i] and rsw[r,i] in the link[r] formed by connecting the TX[r] and the RX[r].

In contrast to open faults that may block the functional signal paths, bridging faults may introduce additional undesirable non-functional signal paths. In some embodiments, the parallel bridging test procedure described below is provided to detect non-functional signal paths created by the bridging faults. The switch control inputs for bridging faults may be used establish the test paths through the non-functional paths. The bridging faults may short any interconnection wires across the different links. The bridging fault may introduce the non-functional paths among the interconnection wires with both the same polarity or with the complementary polarity.

In some embodiments, bridging faults may be detected by applying test patterns to each channel link with all the switches closed. In an embodiment of a test structure, this may be incorporated into the open test procedure described above by changing the required control input to '1101' and '1110' from '1010' and '0101', provided that the different patterns may be generated from each TX. The controls in the open test procedure, when the bridging test is incorporated, may be controls=('1110', '1101'). The original test configurations, i.e. '1010' and '0101' for all links, may be used for diagnosis of open faults.

If all switches are closed in each TX, bridging faults may cause test pattern waveforms to be interfered or distorted so that they are not successfully recovered at the receiver, especially when only one of the differential interconnection wires is open. Hence, an error may result and may be detected by the BIST hardware. The disabled RX interconnection may be utilized to ensure that data recovery does not occur in the presence of bridging faults. Without this implementation in the RX, there may be a risk of bridging faults being masked by cancellation of the test pattern waveform if those bridging faults occurred on complementary interconnections between the links, such as, for example, an interconnection of one link and a complementary interconnection of a neighboring link as shown in FIG. 3.

In some embodiments, if the different test patterns for all links under test are available for a test, the bridging fault detection may be accomplished in two test runs or with two test configurations, a first run with the rsw[r,0] closed and a second run with the rsw[r, 1] closed for all r. Hence, the complexity of testing is O(1).

In some embodiments, the different test patterns utilized in fault detection may be derived from a pseudorandom test pattern generator. A pseudorandom test pattern is commonly used in a functional test, and may be generated using a pseudorandom binary sequence (PRBS) pattern generator. The PRBS pattern generator is generally based on a particular generation polynomial. Starting from the initial state, the generator generates the distinct sequence of test patterns consisting of $(2^k-1) \times k$ bits before the sequence repeats, where k is the highest order of the generation polynomial. In some embodiments, in order to create diversified patterns for fault detection, different initial states may be assigned to the PRBS pattern generators resided in the transmitters which employ the same PRBS generation polynomial. If varying PRBS polynomials are employed, then the initial state will not of concern.

Figure 14:
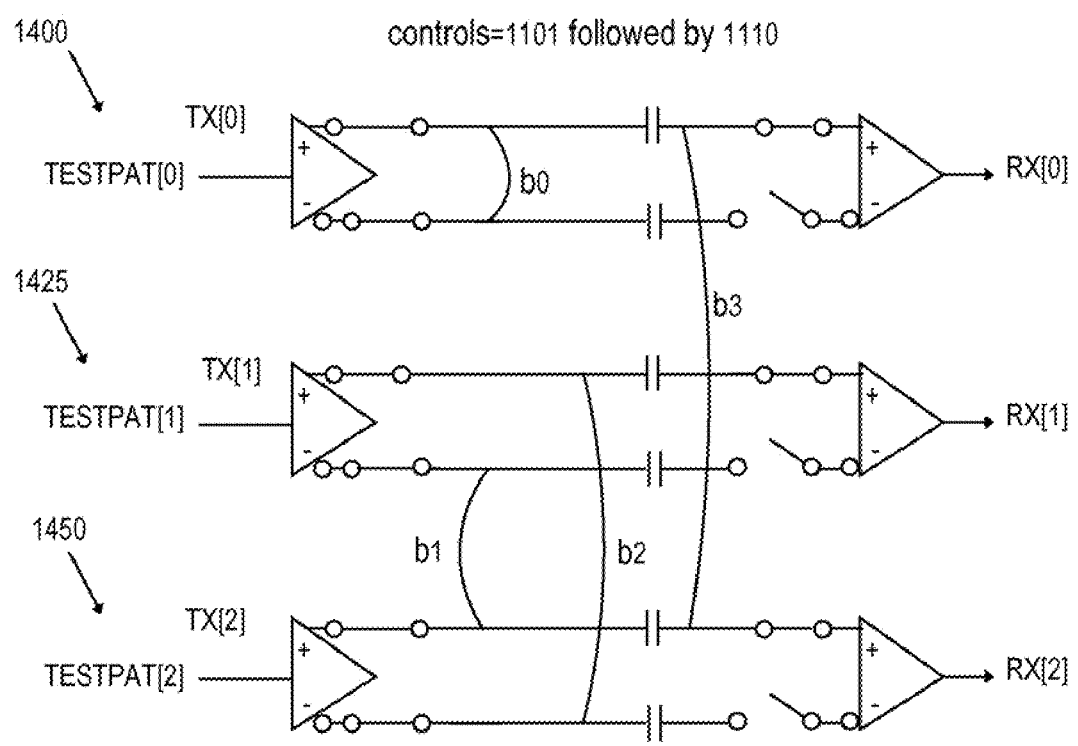
FIG. 14 is an illustration of an embodiment of bridging fault detection.

FIG. 14 is an illustration of an embodiment of bridging fault detection. This illustration contains an example of three circuits (circuits 1400, 1425, and 1450) that may include multiple bridge faults, shown as faults b0, b1, b2, and b3. If the test configurations shown in FIG. 14 are used for an open fault test, the bridging test may be overlapped with the open test. The opened switches in the test paths established by the test configurations '1101' and '1110' may be utilized to reduce bridging fault masking. Fault masking may occur when the multiple bridging faults cause the test pattern waveform in the one of complementary interconnection wires to disappear and the test pattern waveform may be recovered via the remaining interconnection path. By disabling the alternative signal propagation path, the bridging fault may be detected.

In some embodiments, the interconnection test for the bridging faults may be carried out with any two available test patterns with the previously discussed complementary test configurations established by controls=('1001', '0110'). The preferable test patterns may be '1010 . . . 10' and its bitwise complement, '0101 . . . 01' but in the alternative a pair of test patterns, preferably patterns that contain the greatest number of transitions, may be selected from the available test patterns in the BIST hardware. These simple requirements of a complementary test configuration and two preferable complementary test patterns, which can be applied to a parallel interconnection test approach discussed below, may be utilized to provide a viable specification for a manufacturing board test. If the test structures and two preferable complementary test patterns were made available in each IC device on the board under test, the HSIO interconnection test can be performed in parallel.

In an embodiment of a test method, bridging faults on complementary interconnection wires may be targeted first because these faults may be detected from the proposed test configuration shown in, for example, FIG. 7. However, not all bridging faults may be detected from the test configuration in FIG. 7. The bridging faults on the interconnection wires with the same polarity, for example, would not be detected in the test configuration in FIG. 7. The interconnection wires with the same polarity that contain the undetected bridging faults may be transformed into the complementary interconnection wires by configuring the switch controls and the test patterns so that the bridging test environment for complementary interconnection wires can be applied. The transformations may then be continuously applied until all bridging faults are detected.

In some embodiments, a parallel approach to test bridging faults on complementary wires may be the same or similar to the parallel open test described above, with the exception of switch control values and error detection criteria. The given switch control values, '1001' and '0110', may establish the test paths illustrated in FIG. 7. In some embodiments, the error detection criteria and the error report may similar to those discussed in the test procedure described above with for detection of interconnection faults. An error may be determined based at least in part on the fact that a received test pattern is a complement of the transmitted test pattern.

Figure 15:
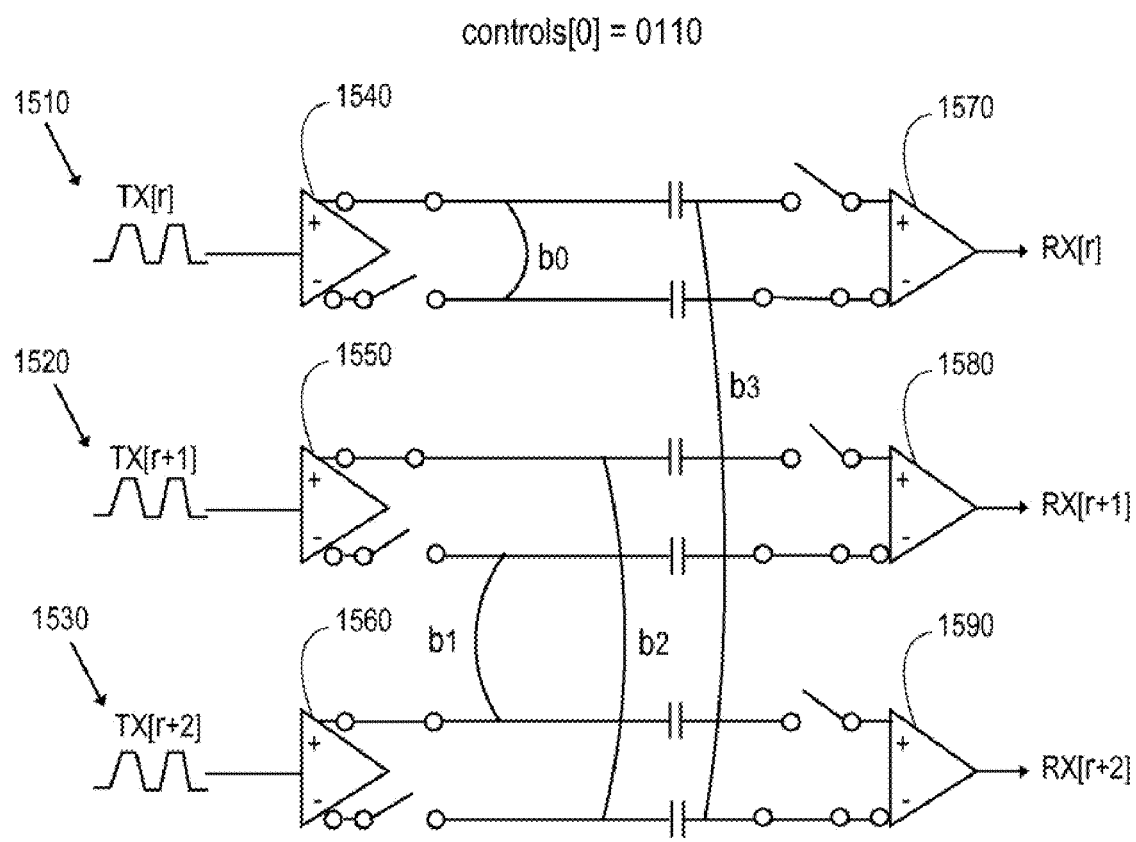
FIG. 15 is an illustration of an embodiment of complementary bridging fault detection.

FIG. 15 is an illustration of an embodiment of complementary bridging fault detection. The bridging faults may be detected in the test paths configured by the controls[0][3:0]='0110'. In this implementation, note that txc[r, 1:0]^rxc[r, 1:0]=controls[0][r, 3:0], where the symbol ^ denotes concatenation. If the test paths are established as shown in FIG. 15 for illustrated circuits 1510 (transmitter 1540 and receiver 1570), 1520 (transmitter 1550 and receiver 1580), and 1530 (transmitter 1550 and receiver 1590), the targeted bridging faults may be observed at the receivers. For example, the bridging fault b0 and b1 may be observed at the receivers RX[r] 1570 and RX[r+1] 1580. The b2 and b3 bridging faults may be observed at the receiver RX[r+2] 1590. The detection of multiple bridging faults b2 and b3, if they occur at the same time, may be more complicated due to signal interference between test pattern waveform from TX[r] 1540 and TX[r+1] 1550 to the RX[r+2] 1590. The signal interference may be constructive or destructive depending on delay between the test pattern waveforms originated from the TX[r] 1540 and TX[r+1] 1550. If the test pattern waveforms are in phase (constructive) or out of phase (destructive), for example, the resulted signal observed at the receiver RX[r+2] 1590 may be increased in amplitude, or no signal may be observed. Thus, fault detection of multiple faults in this test configuration may depend on the phase differences between the propagated waveforms resulting from the multiple bridging faults. If the phase differences are small, the faults may be observed at the receiver.

In some embodiments, the same bridging faults may be detected in the complementary test paths established by the controls[1][3:0]='1001'. The multiple bridging faults b2 and b3, however, may cause the amplitude of test pattern waveforms propagated to the R[r] 1530 and R[r+1] 1550 to be one-half of the original amplitude provided from the TX[r+2] 1560. The half-amplitude may still be observed, depending on the implementation. Without an embodiment of a test structure, however, there may be a greater risk of, for example, multiple bridging faults b2 and b3 being masked at the receivers RX[r] 1570 and RX[r+1] 1580. This is because, without the complementary path being properly isolated, the test patterns from the TX[r] 1540 and the TX[r+1] 1550 may make data recovery possible at the receivers RX[r] 1570 and RX[r+1] 1580 respectively.

In general, if the number of multiple bridging faults per interconnection wire is increased to lower the amplitude of the resulted test pattern waveforms below what the design spec would allow, there may be a risk of masking the multiple bridging faults present in a test configuration. The undetected multiple bridging faults in this test configuration, however, may be detected in the other test configurations, as described below.

In some embodiments, a parallel fault detection test may be utilized to reliably detect bridging faults if they create signal paths, in a given test configuration, among the enabled test pattern sources and sinks that are free of interference in a given test configuration. The test pattern source and the sink are said to be free of interference if they are connected to only one sink and to one source respectively. The parallel fault detection may locate the interconnection faults if such faults are reliably detected in both a given test configuration and the complemented test configuration. An example of reliably located multiple bridging faults may include one bridging fault per interconnection wire. If multiple faults on the interconnection wires need to be located, the diagnosis method described above may be applied.

In some embodiments, bridging faults on complementary interconnection wires may be efficiently detected by the test illustrated in FIG. 15. However, all bridging faults in such test configurations may not be detected. For example, bridging faults residing on the interconnection wires with the same polarity, would not be detected. To address the undetected bridging faults, the test configurations may be set up to transform the problem into a test of complemented interconnection wires.

Figure 16:
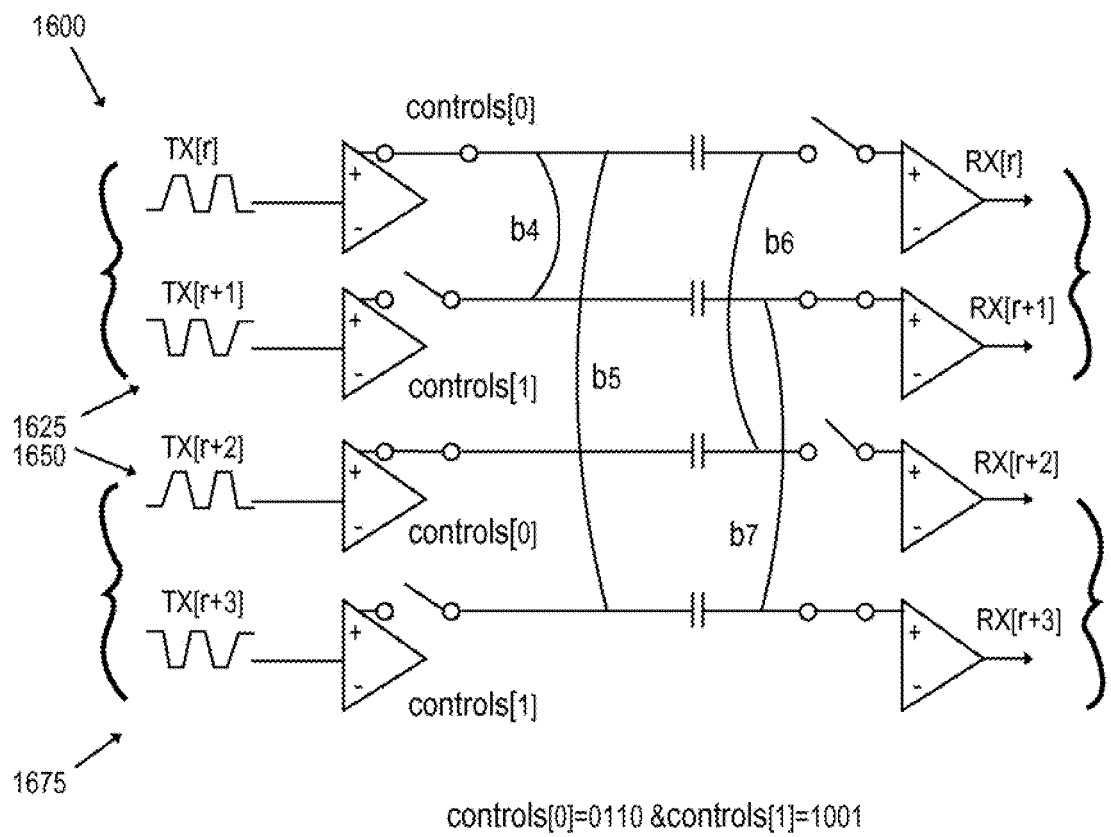
FIG. 16 is an illustration of an embodiment of bridging fault detection for wires with the same polarity.
Figure 17:
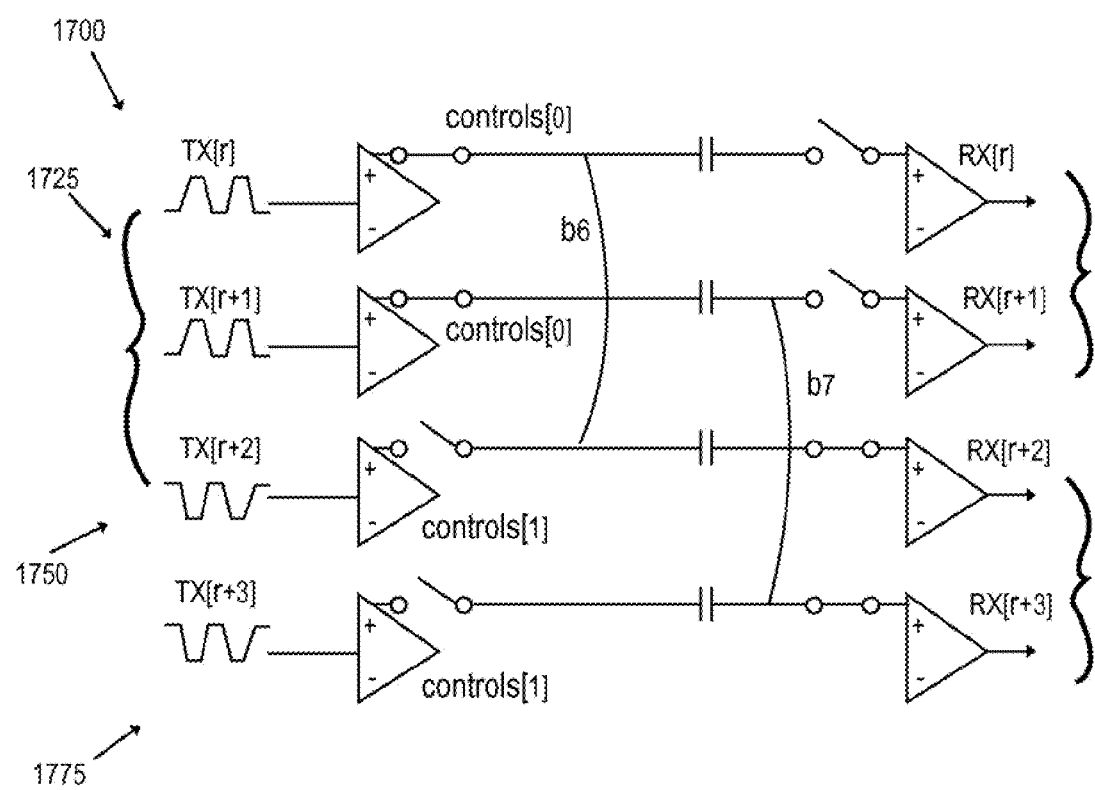
FIG. 17 is an illustration of an embodiment of bridging fault detection for wires with the same polarity.

FIGS. 16 and 17 illustrate embodiments of bridging fault detection for wires with the same polarity. Because bridging fault detection among negative interconnection wires can identically be carried out in parallel with the positive interconnection wires, bridge fault detection for wires with the same parity is illustrated with the positive interconnections of links. FIG. 16 is an illustration of an embodiment of bridging fault detection for wires with the same polarity in a parallel test environment. As illustrated, the bridging fault detection may include the test algorithm presented in Table 5. Bridging fault detection on the positive interconnection wires is depicted in FIG. 16, illustrating bridging faults between circuits 1600, 1625, 1650, and 1675. In this illustration, all bridging faults, such as bridging faults b4 through b7, may not be detected in the test configuration shown in FIG. 15. In some embodiments, the bridging faults b4 and b5 shown in FIG. 16 may be detected if the odd numbered positive links are configured to behave as the negative links, or vice versa. In other words, if the positive (negative) interconnection of link [r+1], or link[r+$2^k$] for k=0, may be configured to emulate the negative (positive) interconnection of link[r], the bridging faults between the even and odd numbered links may be detected.

In some embodiments, the transformation may be achieved by providing the complementary switch control values to the link[r+$2^0$] and the complementary test pattern waveform (or different test waveform from the link[r]), as shown in FIG. 16. In this configuration, a bridging test may be utilized to detect the bridging faults b4 and b5, which would not be detected in the bridging test illustrated in FIG. 15. In this implementation, the switch control inputs for each link are not the same. The switch controls for the link[r] and the link[r+2] are controls[0]='0110', and for the other links, link[r+1] and link[r+3], the switch controls are controls[1]='1001'.

However, the test configuration illustrated in FIG. 16 may not detect all faults with wires having the same polarities. The bridging faults b6 and b7, for example, are not detected in this test configuration provided in FIG. 16. FIG. 17 is an illustration of an embodiment of bridging fault detection for wires with the same polarity in a parallel test environment. As illustrated, bridging fault detection may utilize the test algorithm presented in Table 5. In order to detect the bridging faults b6 and b7, the same transformation may be applied to the positive (negative) interconnection of link[r+$2^1$] to emulate the negative (positive) interconnection of link [r], resulting in the test configuration shown in FIG. 17, illustrating bridging faults between circuits 1700, 1725, 1750, and 1775. In some embodiments, the same transformation may be applied to a pair of interconnection wires that contain undetected bridging faults. A test configuration that may detect the undetected bridging faults such as b6 and b7 is shown in FIG. 17. In this illustration, the bridging faults b6 and b7 may be detected at the receivers RX[r+2] and RX[r+3].

In general, the positive (negative) interconnection of link [r+d] may be configured or transformed to behave as the negative (positive) interconnection of link[r] or vice versa, where $0 \leq r \leq N-(d+1)$ and d=$2^k$, $0 \leq k \leq \lceil \log_2 N \rceil - 1$ where $\lceil x \rceil$ is a ceiling operator to return the equal or the next greater integer of $x \in R$. For example, $\lceil 2.0 \rceil = 2$, $\lceil 2.01 \rceil = 3$ and $\lceil 0.52 \rceil = 1$. In order to detect the bridging faults bet pair of positive (negative) interconnection wires, the targeted interconnections may be tested for all ranges of k. As a result, the number of transformations required may be $\log_2 N$ and hence, the same number of test configurations needs to be tested.

FIG. 18 illustrates test configurations to detect bridging faults. In this illustration, as an example, test configurations are provided to detect bridging faults on the interconnection wires of eight links. When k=0 and d=$2^0$, the test may be carried out with the test configuration, denoted as config[0] [7:0]='10101010', to detect the bridging faults illustrated in FIG. 16. The test may continue with the k=1 and 2, d=$2^1$ and d=$2^2$, with corresponding config[1]='11001100' as illustrated in FIG. 17 and config[2]=11110000. The test configuration config[3]=00000000 as illustrated in FIG. 15 may be employed to detect bridging faults within each link. In some embodiments, bit-wise complementary of test configurations may be used to locate open fault coupled with bridging faults. The bit-wise complement of config[k] for k=0,1,2,3 may be 01010101, 00110011, 00001111 and 11111111, respectively. Asymmetric bridge fault detection in DET complemented with results from open fault detection may be used to identify location of the open faults, i.e., left or right of a bridging fault, as discussed earlier. In some embodiments, the complex multiple bridging faults may be projected to simpler bridging faults in each test configuration so that diagnostic resolution may be increased.

The switch control inputs for each link are denoted as the value of index i in the controls[i]. If any pair of links are configured with the controls[i] and the controls[j] for i≠j, the test pattern applied to one link may be bit-wise complement of the other.

If the test configurations in FIGS. 16 and 17 were interpreted as columns of binary numbers, the combined columns provide a binary representation of the ordered numbers from 0 to $2^2$-1. That is, 00, 01, 10, and 11 are binary representations of 0, 1, 2, and 3, respectively. Conversely, if there were four links on the board under test that share the BIST hardware with the per-link basis complementation capability, the test configurations may be obtained from the columns of ordered numbers from 0 through 3 represented in binary numbers.

In general, the test configurations for testing interconnection wires with the same polarity in the N number of links may be obtained from the columns of the ordered numbers from 0 to N-1 expressed in binary numbers. For example, the test configurations of 8 links may be obtained from the ordered numbers 0 to 7 in binary, i.e. 000, 001, 010, 011, 100, 101, 110, and 111. The required test configurations may be obtained from the columns of binary numbers as illustrated in FIG. 18. There may be $\lceil \log_2 8 \rceil = 3$ test configurations for testing interconnection wires with the same polarity and they are '00001111', '00110011' and '01010101'.

An embodiment of a parallel bridging test is summarized in Table 5.

TABLE 5

Parallel Bridging Test Procedure
Parallel bridging test procedure

```
Bridging test {
  test_pattern = 101010...10;
  controls = (1001, 0110); // controls[1] = 1001 & controls[0] = 0110
  for (k=0; k≦⌈log₂ N⌉; k++) { // N: number of HSIO links on board
  under test
    p = 2^k; iInCtrls = 0; r = 0;
    while (r < N) { // Generation of test configurations
      for (q=0; q<p; q++) { config[k][r] = iInCtrls;
        test_pattern[r] = test_pattern ⊕ config[k][r];
        r = r + 1; }
      iInCtrls = iInCtrls ⊕ 1; } // end while
    for all r in the link[r] = (TX[r], RX[r]), do in parallel {
      txc[r, 1:0] rxc[r, 1:0] = controls[ config[k][r] ];
      bist_error[r] = 0; error[r] = 0;
      for ( m=0; m<M-1; m++;) {
        transmit_and_receive (TX[r], RX[r], test_pattern[r]);
        err[r] = ( received[r] == (test_pattern[r] ⊕ 1) );
        bist_error[r] = err[r] | bist_error[r];
        error[r] = bist_error[r] | signal_detected[r] | error[r];
        if (error[r]) { report (bridging, (k, r, controls[config[k][r]])); } }}
    for (r=0; r<N; r++) { config[k][r] = config[k][r] ⊕ 1; } } // end for
    (k=0 ...
}
```

As described above, there may be $\lceil \log_2 N \rceil + 1$ test configurations and each test configuration may be tracked by the k in the outermost for-loop. The test configurations required for the bridging test may be generated in the While-loop in Table 5. If, for example, there were eight links under test (N=8), the generated test configurations, denoted as config[k][7:0] or simply config[k], may be config[0]='10101010', config[1]='11001100', conf[2]='11110000' and config[3]='00000000'. The k-th test configuration of link[r] is denoted as config[k][r]. The test pattern or its complemented test pattern may be applied depending on the config[k][r]. In order to transform the positive link[r] to emulate the negative link[r+d], for example, the config[k][r]=1 and the test pattern may be complemented. The symbol $\oplus$ denotes XOR operation and test_pattern $\oplus$ config[k][r] denotes a bit-wise XOR operation of test pattern with config[k][r]. Thus, if config[k][r]=1, the test pattern is complemented.

In some embodiments, the bridging faults between the positive interconnection wires and between the negative interconnection wires may be targeted in parallel using the same test configurations. Thus, the proposed bridging may be executed for all k from 0 to $\lceil \log_2 L \rceil$. Hence, the complexity of proposed parallel bridging test is $O(\log_2 L)$ The test complexity of the entire proposed parallel test is also $O(\log_2 L)$. This is because the number of test configurations for all other tests is constant. The total number of test configurations may be dominated by the number of bridging test configurations, which is $\log_2 L$.

Figure 19:
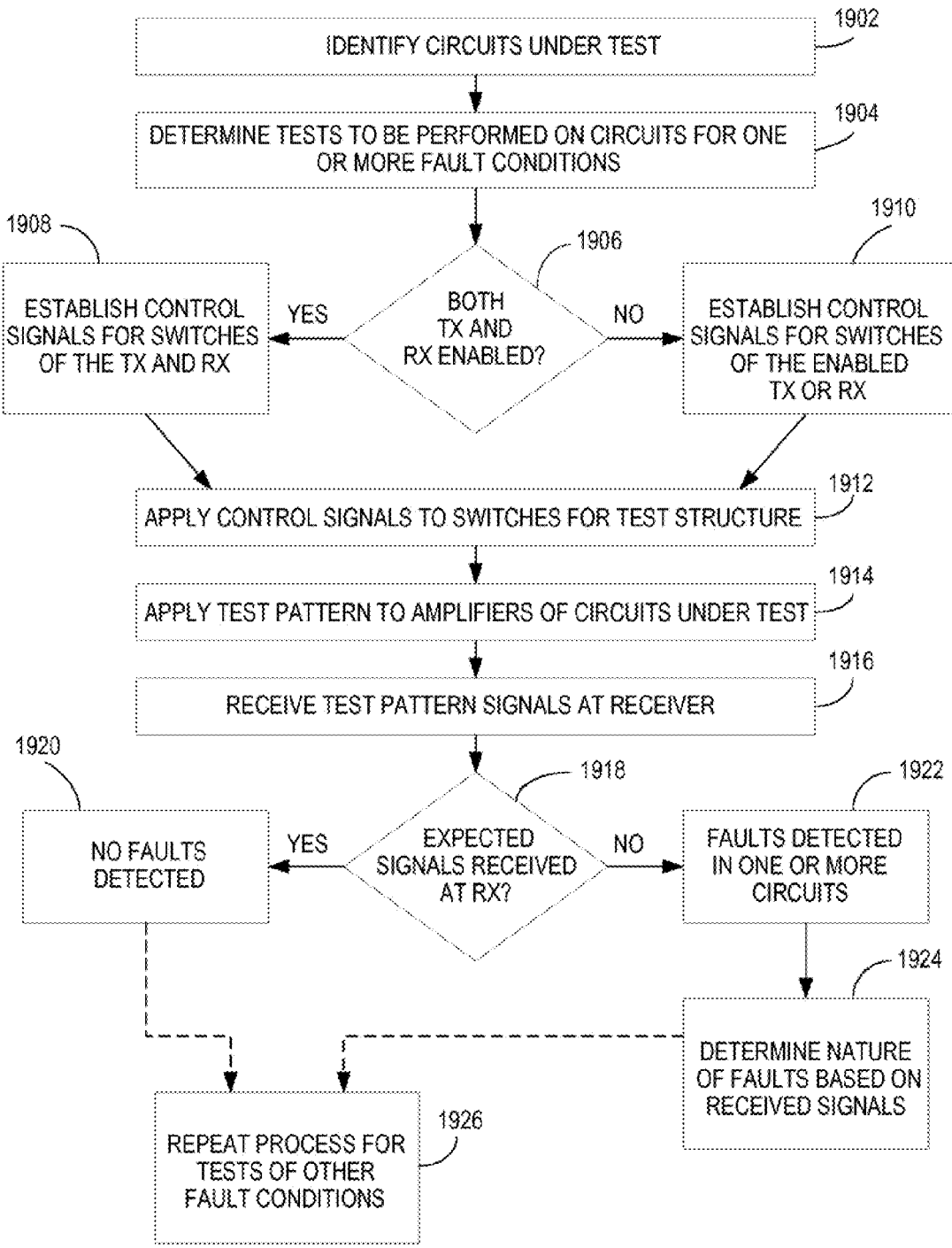
FIG. 19 is a flowchart to illustrate an embodiment of interconnection fault testing.

FIG. 19 is a flowchart to illustrate an embodiment of interconnection fault detection. In this illustration, circuits to be tested are identified 1902 and the tests to performed for one or more fault conditions are determined 1904. For example, tests may be planned for one or more of an open fault, a bridge fault, a stuck-at fault, or a crosstalk fault test. Further, a test may be for a combination of such faults, and may test multiple circuits in parallel. If both a transmitter and receiver of a circuit are enabled for fault detection 1906, as in including or supporting switches to establish signal paths (or test paths) for fault detection, then control signals are established for the switches of the transmitter and receiver sides of an interconnection 1908. If the transmitter and receiver are not both enabled for fault detection (i.e., if only the transmitter or the receiver is enabled for fault detection), then control signals are established for the switches of the transmitter or receiver that is enabled 1910.

The control signals are then applied to the appropriate switches of the test structure 1912, and test patterns are applied to the transmitters of the circuits under test 1914, according to the test structure for the fault detection. Test pattern signals then may be received at the receivers of the circuits under test 1916, with such received signals potentially including one or more errors that indicative of faults. In other embodiments, the test pattern signals may be applied directly to the receivers of the circuits utilizing a tester that provides the required signals. If expected signals are received at the receivers (no errors are detected) 1918, then it may be concluded that there are no faults detected 1920. If the expected signals are not received (one or more errors are detected), then it may be concluded that one or more faults have been detected in one or more circuits 1922. The system may then determine the nature of faults detected 1924, which may include combining results of multiple tests. The process may then continue with repeating the process for tests of other fault conditions 1926, as required for the circuits under test.

Figure 20:
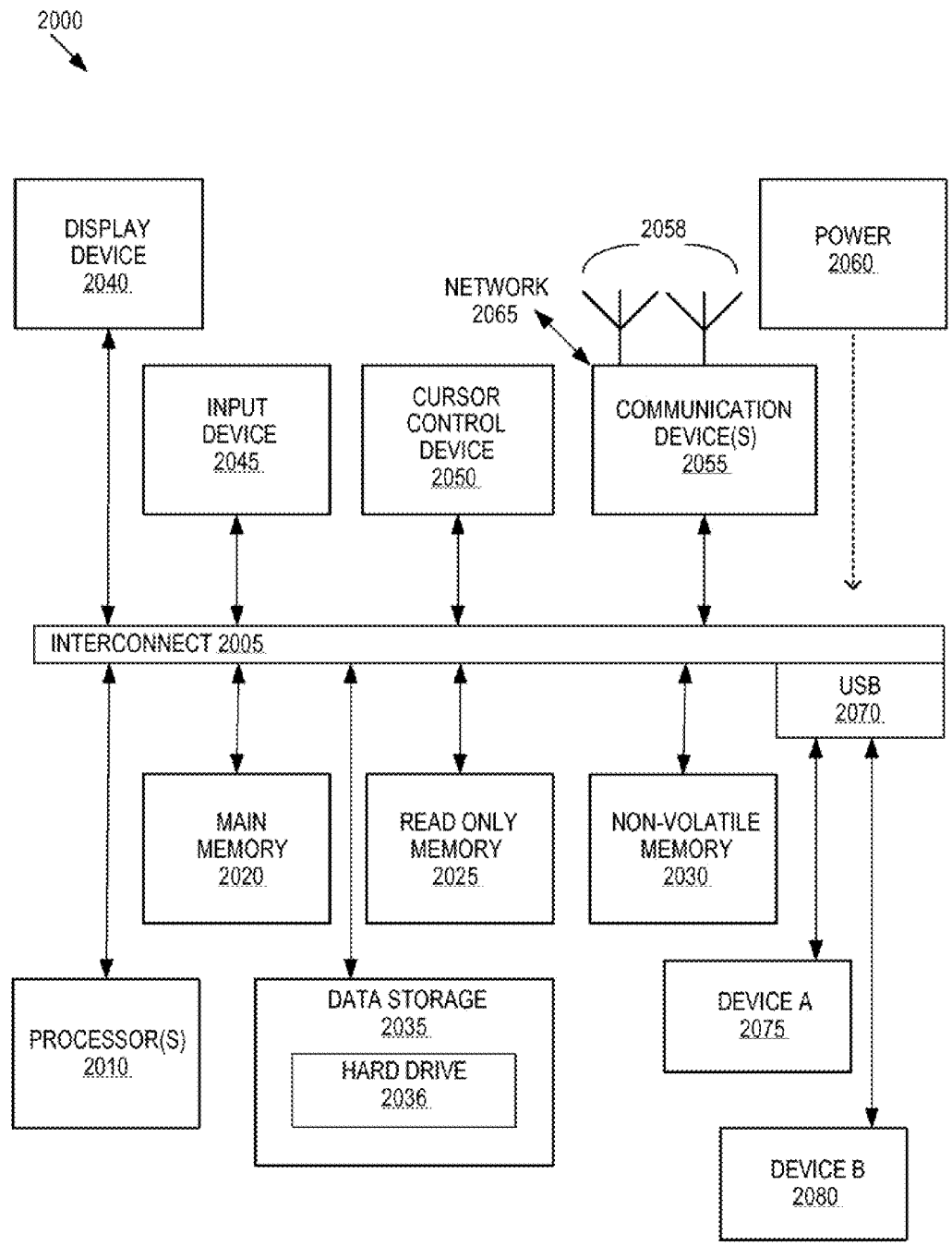
FIG. 20 is an illustration of an embodiment of a device included in an embodiment of fault testing.

FIG. 20 is an illustration of an embodiment of a device that may be included in an embodiment of the invention. In this illustration, certain standard and well-known components that are not germane to the present description are not shown. Under some embodiments, a device 2000 may be a transmitting device, a receiving device, or both.

Under some embodiments, the device 2000 comprises an interconnect or crossbar 2005 or other communication means for communicating information, which may include high speed data transport. The device 2000 further includes a processing means such as one or more processors 2010 coupled with the interconnect 2005 for processing information. The processors 2010 may comprise one or more physical processors and one or more logical processors. Further, each of the processors 2010 may include multiple processor cores. The interconnect 2005 is illustrated as a single interconnect for simplicity, but may represent multiple different interconnects or buses and the component connections to such interconnects may vary. The interconnect 2005 shown in FIG. 20 is an abstraction that represents any one or more separate physical buses, point-to-point connections, or both connected by appropriate bridges, adapters, or controllers. The interconnect 2005 may include, for example, a system bus, a PCI or PCIe bus, a HyperTransport or industry standard architecture (ISA) bus, a small computer system interface (SCSI) bus, a IIC (12C) bus, or an Institute of Electrical and Electronics Engineers (IEEE) standard 1394 bus, sometimes referred to as "Firewire". ("Standard for a High Performance Serial Bus" 1394-1995, IEEE, published Aug. 30, 1996, and supplements) The device 2000 further may include a serial bus, such as USB bus 2770, to which may be attached one or more USB compatible devices, such as device A 2075 and device B 2080.

In some embodiments, the processors 2010 may be utilized to support one or more virtual machines. In some embodiments, the device 2000 further comprises a random access memory (RAM) or other dynamic storage device as a main memory 2020 for storing information and instructions to be executed by the processors 2010. Main memory 2020 also may be used for storing temporary variables or other intermediate information during execution of instructions by the processors 2010. RAM memory includes dynamic random access memory (DRAM), which requires refreshing of memory contents, and static random access memory (SRAM), which does not require refreshing contents, but at increased cost. DRAM memory may include synchronous dynamic random access memory (SDRAM), which includes a clock signal to control signals, and extended data-out dynamic random access memory (EDO DRAM). In some embodiments, memory of the system may include a shared memory, such as a shared BIOS/OS memory, that is accessible by multiple agents in the device. The device 2000 also may comprise a read only memory (ROM) 2025 or other static storage device for storing static information and instructions for the processors 2010. The device 2000 may include one or more non-volatile memory devices 2030 for the storage of certain elements.

Data storage 2035 may also be coupled to the interconnect 2005 of the device 2000 for storing information and instructions. The data storage 2035 may include a magnetic disk, an optical disc and its corresponding drive, or other memory device. Such elements may be combined together or may be separate components, and utilize parts of other elements of the device 2000. In a particular embodiment, the data storage 2035 may include a hard drive 2036.

The device 2000 may also be coupled via the bus 2005 to a display 2040, such as a liquid crystal display (LCD), a plasma display, a cathode ray tube (CRT) display, or any other display technology, for displaying information to an end user. In some embodiments, the display (or presentation device) 2040 may be utilized to display television programming. In some environments, the display 2040 may include a touch-screen that is also utilized as at least a part of an input device. In some environments, the display 2040 may be or may include an audio device, such as a speaker for providing audio information, including the audio portion of a television program. An input device 2045 may be coupled to the interconnect 2005 for communicating information and/or command selections to the processors 2010. In various implementations, the input device 2045 may be a keyboard, a keypad, a touch-screen and stylus, a voice-activated system, or other input device, or combinations of such devices. Another type of user input device that may be included is a cursor control device 2050, such as a mouse, a trackball, or cursor direction keys for communicating direction information and command selections to the one or more processors 2010 and for controlling cursor movement on the display 2040.

One or more communication elements 2055 may also be coupled to the interconnect 2005. Depending upon the particular implementation, the communication elements 2055 may include a transceiver, a wireless modem, a network interface card, LAN (Local Area Network) on motherboard, or other interface device. The communication elements 2055 may provide a connection to a network 2065 to transmit network data, such as Ethernet data. The uses of a communication device 2055 may include reception of signals from wireless devices. For radio communications, the communication device 2055 may include one or more antennas 2058, including any dipole or monopole antennas, as required. In one embodiment, the communication elements 2055 may include a firewall to protect the device 2000 from improper access. The device 2000 may also comprise a power device or system 2060, which may comprise a power supply, a battery, a solar cell, a fuel cell, or other system or device for providing or generating power. The power provided by the power device or system 2060 may be distributed as required to elements of the device 2000.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general-purpose or special-purpose processor or logic circuits programmed with the instructions to perform the processes. Alternatively, the processes may be performed by a combination of hardware and software.

Portions of the present invention may be provided as a computer program product, which may include a computer-readable medium having stored thereon computer program instructions, which may be used to program a computer (or other electronic devices) to perform a process according to the present invention. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

What is claimed is:

1. A fault analysis apparatus comprising:
   a test pattern source to provide a test pattern for an interconnection between a transmitter and a receiver, the interconnection having a transmitter end and a receiver end, the interconnection including a first wire and a second wire, the transmitter transmitting the test pattern on the first wire to the receiver;
   a first switch to open and close a first connection for the first wire; and
   a second switch to open and close a second connection for the second wire;
   wherein the first switch and the second switch are to be set according to a configuration to set at least a portion of a test path for the detection of one or more faults in the interconnection; and
   wherein the first switch and the second switch are independently controllable.

2. The apparatus of claim 1, wherein the first switch and the second switch are contained in the transmitter or are coupled with the transmitter end of the interconnection.

3. The apparatus of claim 1, wherein the first switch and the second switch are contained in the receiver or are coupled with the receiver end of the interconnection.

4. The apparatus of claim 1, further comprising a third switch to open and close a third connection for the first wire and a fourth switch to open and close a fourth connection for the second wire, wherein the third switch and the fourth switch are independently controllable.

5. The apparatus of claim 4, wherein the first switch and the second switch are contained in the transmitter or are coupled with the transmitter end of the interconnection, and the third switch and the fourth switch are contained in the receiver or are coupled with the receiver end of the interconnection.

6. The apparatus of claim 1, wherein each of the one or more faults is one of an open fault, a bridge fault, a stuck-at fault, or a crosstalk fault.

7. The apparatus of claim 1, wherein the interconnection is a high speed input-output (HSIO) interconnection.

8. The apparatus of claim 1, wherein the interconnection is DC-coupled.

9. The apparatus of claim 1, wherein the interconnection is AC-coupled.

10. The apparatus of claim 1, wherein the first switch is operable to turn power on or off to the first wire, and the second switch is operable to turn power on or off to the second wire.

11. The apparatus of claim 10, further comprising a first termination resistor coupled between the first wire and a power source and a second termination resistor coupled between the second wire and the power source, wherein the first switch is to turn power on and off through the first termination resistor and the second switch is to turn power on and off through the second termination resistor.

12. The apparatus of claim 1, wherein the transmitter is a tester to apply signals to the receiver.

13. A method comprising:
applying a first test pattern to a first wire of an interconnect, the interconnect including the first wire and a second wire;
sending a first control signal to a first switch, the first switch to open or close a first connection for the first wire based on the first control signal;
sending a second control signal to a second switch, the second switch to open or close a second connection for the second wire based on the second control signal, the first control signal and second control signal setting at least a portion of a test path for the test pattern;
monitoring the interconnection for received signals; and
determining whether a fault exists in the interconnection based on the monitoring of the interconnection;
wherein the first control signal and the second control signal provide for independent control of the first switch and the second switch.

14. The method of claim 13, further comprising applying a second test pattern to the second wire.

15. The method of claim 14, wherein the first control signal is a complement of the second control signal, and the first test pattern is a complement of the second test pattern.

16. The method of claim 13, wherein each of the one or more faults is one of an open fault, a bridge fault, a stuck-at fault, or a crosstalk fault.

17. The method of claim 13, wherein the interconnect is a high speed input-output (HSIO) interconnection.

18. The method of claim 13, further comprising determining a location of a detected fault in the interconnection.

19. The method of claim 13, wherein the first test pattern is applied to the first wire utilizing a tester.

20. The method of claim 13, further comprising determining a plurality of control signals for one or more interconnects, the plurality of control signals including the first and second control signals, the plurality of control signals being based at least in part on one or more types of faults to be detected in a test.

21. The method of claim 20, wherein the determination of the plurality of control signals includes setting control signals for all wires of the one or more interconnects to the same value to detect bridging faults within each interconnect.

22. The method of claim 20, wherein the determination of the plurality of control signals includes setting a control signal for a positive wire of each interconnect to a first value and a control signal for a negative wire of each interconnect to a second value to detect bridging faults between interconnects.

23. The method of claim 20, wherein the determination of the plurality of control signals includes establishing a first set of control signals and a bitwise complement of the first set of control signals to detect open faults coupled with bridging faults.

24. The method of claim 20, wherein the determination of the plurality of control signals includes determination of a plurality of different sets of control signals for testing bridging faults between wires of the one or more interconnects having the same polarity.

25. The method of claim 13, further comprising:
sending a third control signal to a third switch, the third switch to open or close a third connection for the first wire based on the third control signal; and
sending a fourth control signal to a fourth switch, the fourth switch to open or close a fourth connection for the second wire based on the fourth control signal;
wherein the third control signal and the fourth control signal provide for independent control of the third switch and the fourth switch.

26. A fault analysis system comprising:
a first set of switches to open and close connections for a first interconnection, the first interconnection including a first wire and a second wire, the first set of switches including two switches for a transmitter side of the first interconnection and two switches for a receiver side of the first interconnection;
a second set of switches to open and close connections for a second interconnection, the first interconnection including a third wire and a fourth wire, the second set of switches including two switches for a transmitter side of the second interconnection and two switches for a receiver side of the second interconnection, the first set of switches and the second set of switches to operate to set at least a portion of a test path;
one or more pattern sources to apply signals to one or more wires of the first interconnection and the second interconnection; and
logic to identify one or more faults in the first interconnection and the second interconnection based on reception of the signals from the one or more pattern sources;
wherein each of the switches of the first set of switches and the second set of switches is independently controllable.

27. The system of claim 26, wherein the logic to identify faults includes a signal detector to determine if the signals are received.

28. The system of claim 26, wherein the logic to identify faults includes an error detector to determine if received signals include an error.

29. The system of claim 26, wherein the logic to identify faults includes logic to determine a location of a detected fault.

30. The system of claim 26, wherein each of the one or more faults is one of an open fault, a bridge fault, a stuck-at fault, or a crosstalk fault.

31. The system of claim 30, wherein the first set of switches are to receive a first set of control signals and the second set of switches are to receive a complement of the first set of control signals, and the one or more pattern sources are to apply a first test pattern to the first and third wires and a complement of the first test pattern to the second and fourth wires, and wherein the logic is to detect bridging faults between wires of the same polarity.

32. The system of claim 26, wherein the interconnection is a high speed input-output (HSIO) interconnection.

33. A computer-readable medium having stored thereon data representing sequences of instructions that, when executed by a processor, cause the processor to perform operations comprising:
  applying a first test pattern to a first wire of an interconnect, the interconnect including the first wire and a second wire;
  sending a first control signal to a first switch, the first switch to open or close a first connection for the first wire based on the first control signal;
  sending a second control signal to a second switch, the second switch to open or close a second connection for the second wire based on the second control signal, the first switch and second switch setting a least a portion of a test path for the first test pattern;
  receiving one or more signals on the interconnection; and
  determining whether a fault exists in the interconnection based on the received signals;
  wherein the first control signal and the second control signal provide for independent control of the first switch and the second switch.

34. The medium of claim 33, wherein the sequences of instructions further include instructions to cause the processor to perform operations comprising:
  applying a second test pattern to the second wire.

35. The medium of claim 33, wherein the sequences of instructions further include instructions to cause the processor to perform operations comprising:
  sending a third control signal to a third switch, the third switch to open or close a third connection for the first wire based on the third control signal; and
  sending a fourth control signal to a fourth switch, the fourth switch to open or close a fourth connection for the second wire based on the fourth control signal.

36. The medium of claim 33, wherein each of the one or more faults is one of an open fault, a bridge fault, a stuck-at fault, or a crosstalk fault.

37. The medium of claim 33, wherein the sequences of instructions further include instructions to cause the processor to perform operations comprising:
  determining a location of a detected fault in the interconnection.

38. The medium of claim 33, wherein the sequences of instructions further include instructions to cause the processor to perform operations comprising:
  determining a plurality of control signals for one or more interconnects, the plurality of control signals including the first and second control signals, the plurality of control signals being based at least in part on one or more types of faults to be detected in a test.

\* \* \* \* \*